(12) United States Patent
Cok

(10) Patent No.: US 9,229,260 B2
(45) Date of Patent: Jan. 5, 2016

(54) IMPRINTED BI-LAYER MICRO-STRUCTURE

(71) Applicant: Ronald Steven Cok, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 233 days.

(21) Appl. No.: 14/012,269

(22) Filed: Aug. 28, 2013

(65) Prior Publication Data

US 2015/0060112 A1    Mar. 5, 2015

(51) Int. Cl.
| | |
|---|---|
| *H05K 1/11* | (2006.01) |
| *G02F 1/1333* | (2006.01) |
| *G06F 3/041* | (2006.01) |
| *H05K 1/02* | (2006.01) |
| *H05K 3/46* | (2006.01) |
| *H01L 27/15* | (2006.01) |
| *H01L 27/32* | (2006.01) |

(52) U.S. Cl.
CPC ............ *G02F 1/13338* (2013.01); *G06F 3/041* (2013.01); *H01L 27/15* (2013.01); *H01L 27/32* (2013.01); *H05K 1/0289* (2013.01); *H05K 3/465* (2013.01); *H05K 2203/0108* (2013.01); *Y10T 428/24777* (2015.01); *Y10T 428/24802* (2015.01)

(58) Field of Classification Search
CPC ................................ H05K 1/11; G02F 1/1345
See application file for complete search history.

(56) References Cited

U.S. PATENT DOCUMENTS

| | | | |
|---|---|---|---|
| 7,202,179 B2 | 4/2007 | Taussig et al. | |
| 8,179,381 B2 | 5/2012 | Frey et al. | |
| 2004/0124533 A1* | 7/2004 | Keser et al. | 257/758 |
| 2004/0213957 A1* | 10/2004 | Kaminsky et al. | 428/141 |
| 2004/0213962 A1* | 10/2004 | Bourdelais et al. | 428/172 |
| 2008/0264699 A1* | 10/2008 | Chang et al. | 178/18.01 |
| 2009/0008142 A1* | 1/2009 | Shimizu et al. | 174/261 |
| 2010/0026664 A1 | 2/2010 | Geaghan | |
| 2010/0328248 A1 | 12/2010 | Mozdzyn | |
| 2011/0007011 A1 | 1/2011 | Mozdzyn | |
| 2011/0099805 A1 | 5/2011 | Lee | |
| 2011/0102370 A1 | 5/2011 | Kono et al. | |
| 2012/0094090 A1* | 4/2012 | Yamazaki et al. | 428/195.1 |
| 2012/0146022 A1* | 6/2012 | Hida et al. | 257/49 |
| 2014/0205810 A1* | 7/2014 | Trauernicht et al. | 428/172 |
| 2014/0335314 A1* | 11/2014 | Aldino et al. | 428/159 |

FOREIGN PATENT DOCUMENTS

CN        102063951        7/2013

\* cited by examiner

*Primary Examiner* — Bruce H Hess
*Assistant Examiner* — Christopher Polley
(74) *Attorney, Agent, or Firm* — Raymond L. Owens

(57) ABSTRACT

An imprinted micro-structure includes a substrate having an edge area and a central area separate from the edge area. A cured bottom-layer, connecting layer, and top layer are formed over the substrate, each with a corresponding imprinted micro-channel having a cured micro-wire. The bottom micro-wire is in the central area and the edge area. The connecting-layer micro-wire contacts at least a portion of the bottom-layer micro-wire in the edge area. A cured edge micro-wire in the top layer contacts at least a portion of the connecting-layer micro-wire in the edge area. A top-layer micro-wire is located in a top-layer micro-channel and is separate from the edge micro-wire and bottom micro-wire. The bottom-layer micro-wire in the central area is electrically connected to the edge micro-wire in the edge area and is electrically isolated from the top-layer micro-wire.

21 Claims, 29 Drawing Sheets

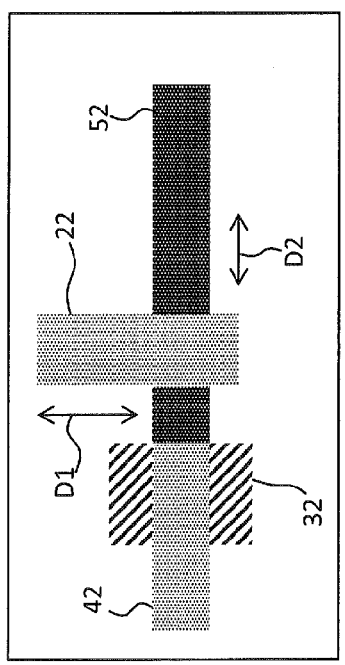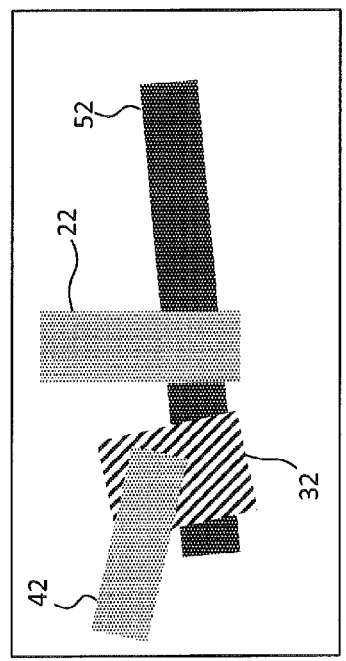
FIG. 3A
FIG. 3B

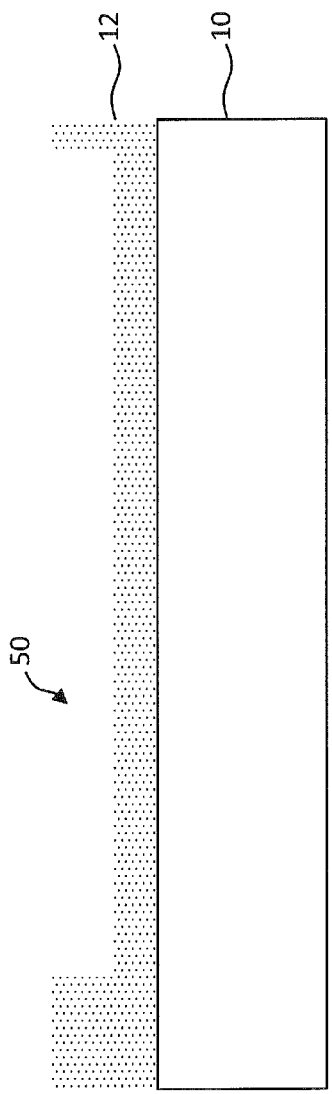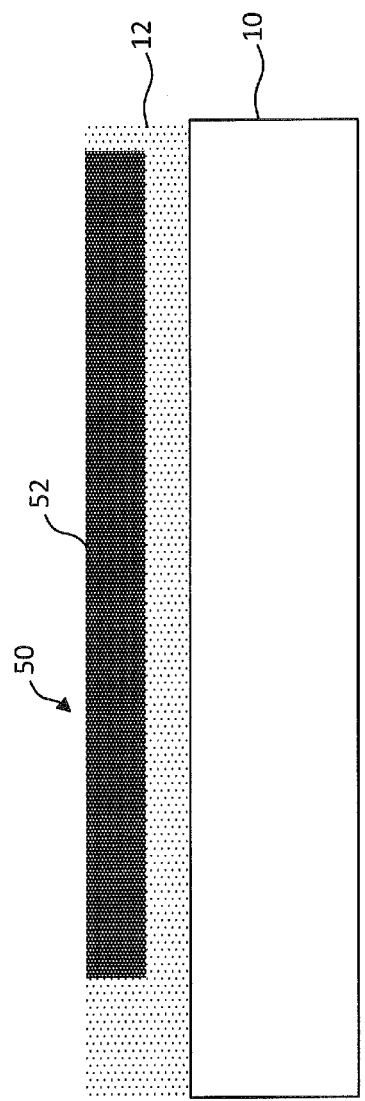

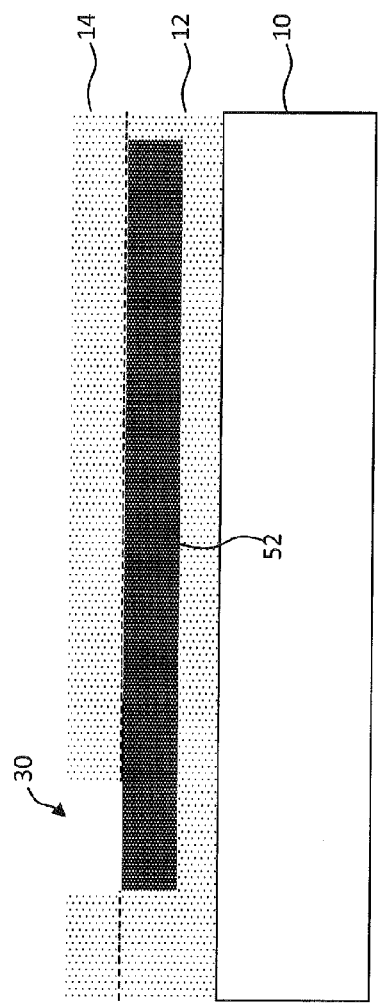
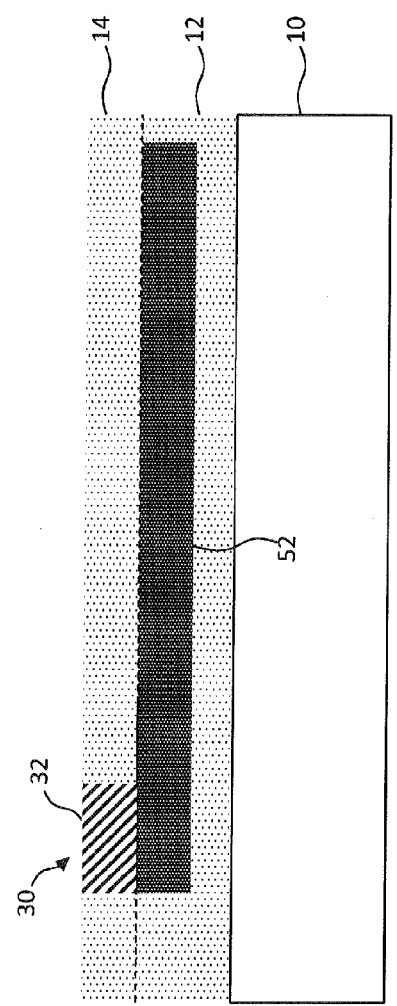

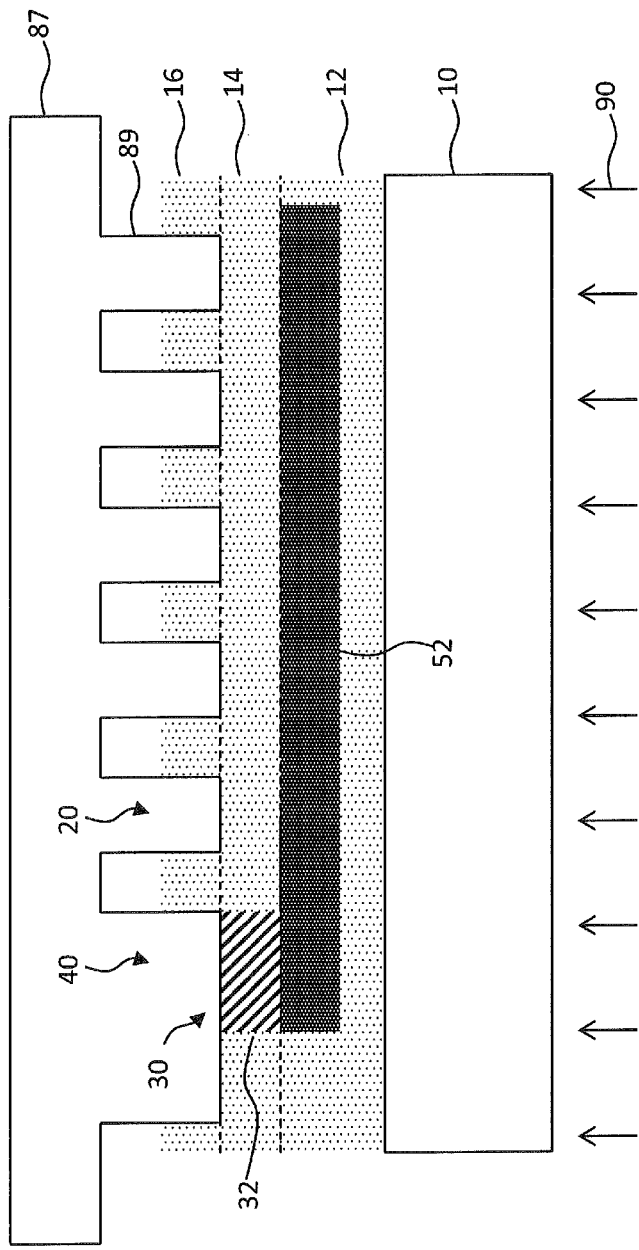

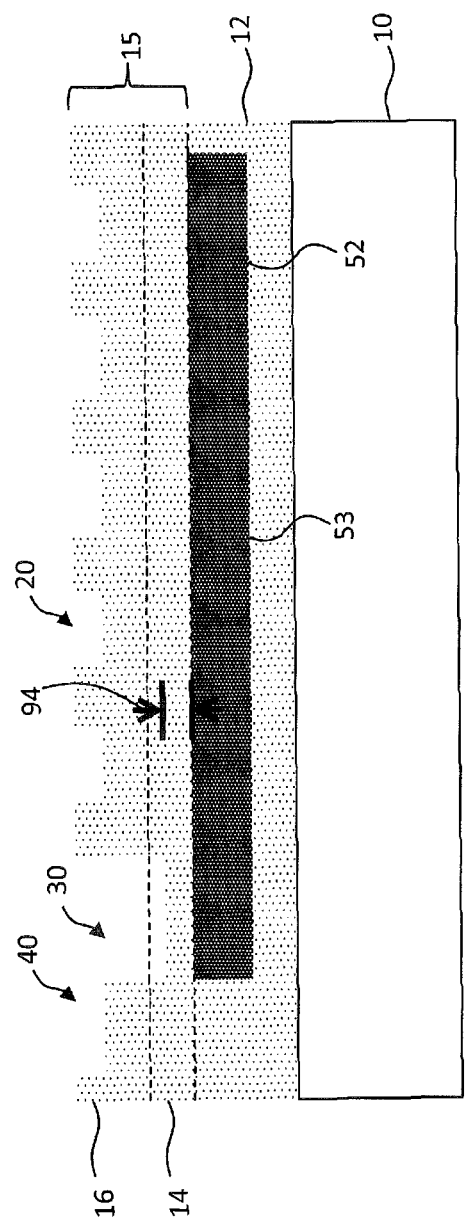

IMPRINTED BI-LAYER MICRO-STRUCTURE

CROSS REFERENCE TO RELATED APPLICATIONS

Reference is made to commonly-assigned, co-pending U.S. patent application Ser. No. 14/012,216 (now U.S. Publication No. 20150060394), filed Aug. 28, 2013, entitled "Imprinted Bi-Layer Micro-Structure Method" by Cok; commonly-assigned, co-pending U.S. patent application Ser. No. 14/012,240 (now U.S. Publication No. 20150060395), filed Aug. 28, 2013, entitled "Imprinted Bi-Layer Micro-Structure Method with Bi-Level Stamp" by Cok; commonly assigned U.S. patent application Ser. No. 14/012,195 (now U.S. Pat. No. 9,078,360), filed Aug. 28, 2013 entitled "Imprinted Multi-Layer Micro-Structure" by Cok, the disclosures of which are all incorporated herein.

Reference is made to commonly assigned U.S. patent application Ser. No. 13/862,586, filed Apr. 15, 2013, entitled "Hybrid Single-Side Touch Screen" by Burberry et al; and commonly assigned U.S. patent application Ser. No. 13/862,679, filed Apr. 15, 2013, entitled "Micro-Channel Structure with Variable Depths" by Cok; the disclosures of which are incorporated herein.

FIELD OF THE INVENTION

The present invention relates to transparent electrodes having electrically conductive micro-wires formed in multiple layers.

BACKGROUND OF THE INVENTION

Transparent electrical conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays.

In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Publication 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels is formed in a substrate using an embossing technique. Embossing methods are generally known in the prior art and typically include coating a curable liquid, such as a polymer, onto a rigid substrate. A pattern of micro-channels is embossed (impressed or imprinted) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example, using patterned radiation exposure or physical masks. Unwanted material (e.g. photosensitive resist) is removed, followed by electro-deposition of metallic ions in a bath.

Conductive micro-wires are used to form a touch switch, for example, as illustrated in U.S. Patent Publication 2011/0102370. In this example, a capacitive touch switch includes a first substrate on which is formed a first mesh-like electrode and a second substrate on which is formed a second mesh-like electrode. The first and second substrates are integrally bonded via an adhesive layer in such a manner that the first and second mesh-like electrodes face each other. Such a design requires the use of two substrates that are aligned and bonded together.

Multi-level masks are used with photo-lithography to form thin-film devices, for example as disclosed in U.S. Pat. No. 7,202,179. An imprinted 3D template structure is provided over multiple thin films formed on a substrate. The multiple levels of the template structure are used as masks for etching the thin films. This approach requires the use of a mask and multiple photo-lithographic steps.

There is a need, therefore, for further improvements in micro-wire structures for transparent electrodes that simplifies manufacturing steps and provides more complex and interconnected patterns.

SUMMARY OF THE INVENTION

In accordance with the present invention, an imprinted micro-wire structure, comprises:

a substrate having an edge area and a central area separate from the edge area;

a cured bottom layer formed in relation to the substrate;

an imprinted bottom-layer micro-channel in the cured bottom layer in at least a portion of the central area and in at least a portion of the edge area, the bottom-layer micro-channel extending from the central area into the edge area;

a cured bottom-layer micro-wire located in the bottom-layer micro-channel, the bottom-layer micro-wire extending from the central area into the edge area;

a cured connecting layer adjacent to and in contact with the cured bottom layer and the bottom-layer micro-wire;

an imprinted connecting-layer micro-channel in the cured connecting layer over at least a portion of the bottom-layer micro-channel in at least a portion of the edge area;

a cured connecting-layer micro-wire located in the connecting-layer micro-channel contacting at least a portion of the bottom-layer micro-wire;

a cured top layer adjacent to and in contact with the cured connecting layer and the connecting-layer micro-wire;

an imprinted edge micro-channel in the cured top layer in at least a portion of the edge area and an imprinted top-layer micro-channel in the cured top layer separate from the bottom-layer micro-channel and over at least a portion of the bottom-layer micro-channel in at least a portion of the central area;

an edge micro-wire located in the edge micro-channel contacting at least a portion of the connecting-layer micro-wire and a top-layer micro-wire located in the top-layer micro-channel that is electrically isolated from the edge micro-wire, the connecting-layer micro-wire, and the bottom-layer micro-wire; and wherein the bottom-layer micro-wire in the central area is electrically connected to the edge micro-wire in the edge area and is electrically isolated from the top-layer micro-wire.

The present invention provides multi-layered micro-wire structures with improved complexity, connectivity, and manufacturability. The micro-wires of the present invention are particularly useful in transparent electrodes for capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 3A-3B are plan views illustrating various embodiments of the present invention having micro-wires with portions that extend primarily in different directions;

FIGS. 6A-6M are cross sections illustrating sequential steps in a method of the present invention that forms the multi-wire structure of FIG. 1;

FIGS. 8A-8B are cross sections illustrating sequential optional steps useful for various methods of the present invention;

The Figures are not drawn to scale since the variation in size of various elements in the Figures is too great to permit depiction to scale.

DETAILED DESCRIPTION OF THE INVENTION

The present invention is directed toward imprinted multi-layer micro-wire structures having electrically conductive micro-wires formed in micro-channel structures in multiple layers over a substrate. In an embodiment, the multi-layer structure is a bi-layer structure Imprinted structures are also known to those skilled in the art as embossed or impressed structures formed by locating an imprinting, impressing, or embossing stamp having protruding structural features in a curable layer, curing the layer, and then removing the stamp to form micro-channels corresponding to the structural features that are then filled with a conductive ink that is cured to form micro-wires.

Figure 1:
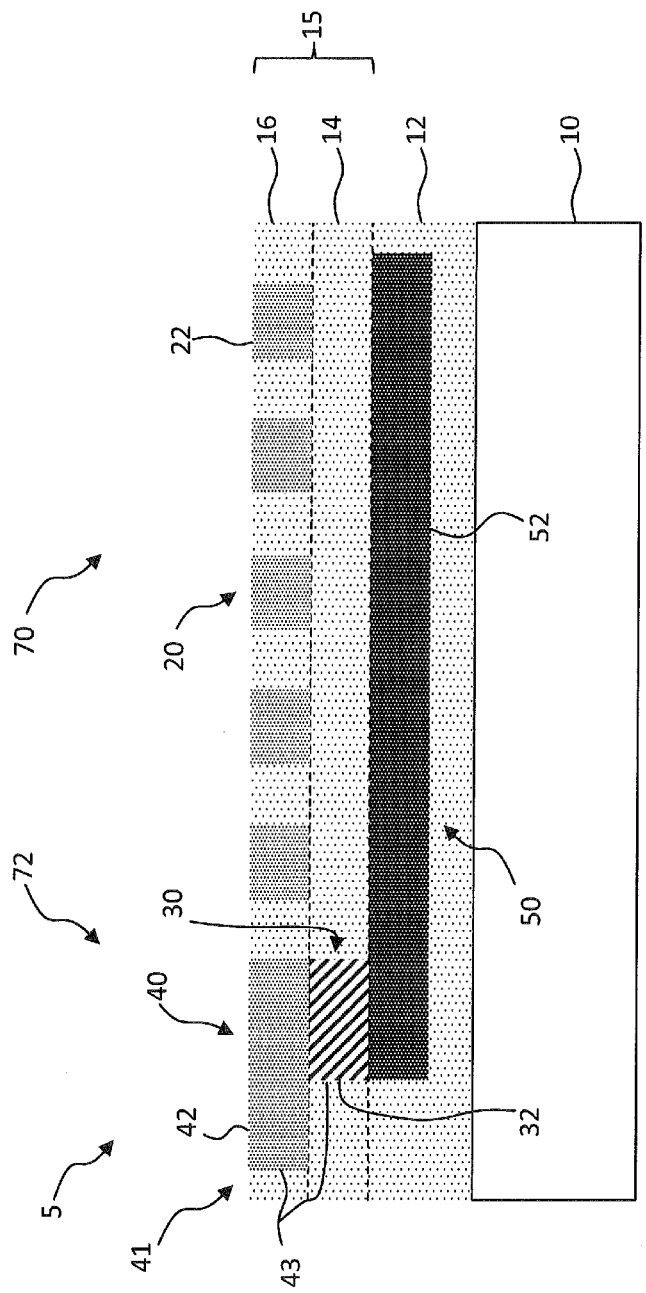
FIG. 1 is a cross section of an embodiment of the present invention.
Figure 2:
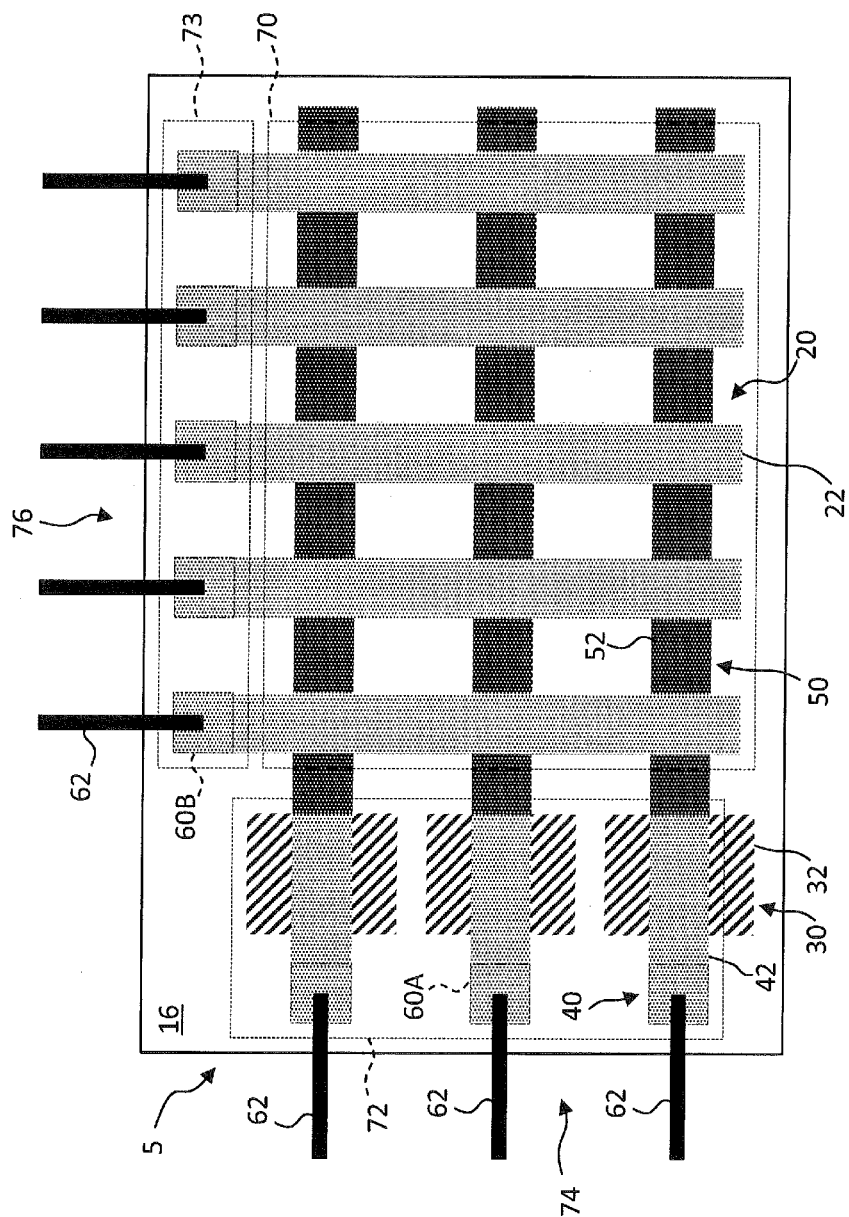
FIG. 2 is a plan view of the embodiment of the present invention corresponding to FIG. 1.

Referring to FIG. 1 in cross section and to FIG. 2 in plan view, according to an embodiment of the present invention an imprinted micro-wire structure 5 includes a substrate 10 with a bottom layer 12, a connecting layer 14, and a top layer 16 formed in relation to the substrate 10. The connecting layer 14 is between the bottom layer 12 and the top layer 16 so that the connecting layer 14 is adjacent to and in contact with the bottom layer 12 and the connecting layer 14 is also adjacent to and in contact with the top layer 16. The substrate 10 includes an edge area 72 and a central area 70.

A bottom-layer micro-channel 50 is imprinted in the bottom layer 12 in at least a portion of the central area 70 and in at least a portion of the edge area 72, the bottom-layer micro-channel 50 extending from the central area 70 into the edge area 72. A bottom-layer micro-wire 52 is located in the bottom-layer micro-channel 50 so that the bottom-layer micro-wire 52 likewise extends from the central area 70 into the edge area 72. An imprinted connecting-layer micro-channel 30 is in contact with at least a portion of the bottom-layer micro-wire 52 in at least a portion of the edge area 72. A connecting-layer micro-wire 32 is located in the connecting-layer micro-channel 30 contacting at least a portion of the bottom-layer micro-wire 52. An imprinted edge micro-channel 40 is in the top layer 16 in at least a portion of the edge area 72 contacting at least a portion of the connecting-layer micro-wire 32. Top-layer micro-channels 20 are also in the top layer 16 in at least a portion of the central area 70 and are separate from the edge micro-channel 40 and the bottom-layer micro-channel 50. An edge micro-wire 42 is located in the edge micro-channel 40 contacting at least a portion of the connecting-layer micro-wire 32. Top-layer micro-wires 22 are located in the top-layer micro-channels 20 and are separate from both the edge micro-wire 42 and the bottom layer micro-wire 52. The edge micro-wire 42 is electrically connected to the bottom-layer micro-wire 52 through the connecting-layer micro-wire 32 and is electrically isolated from the top-layer micro-wire 22.

In another embodiment of the present invention, the connecting layer 14 and the top layer 16 are a single multi-layer 15. Similarly, in an embodiment, edge micro-channel 40 and connecting-layer micro-channel 30 are a single multi-layer micro-channel 41 and edge micro-wire 42 and connecting-layer micro-wire 32 are a single multi-layer micro-wire 43.

Micro-wires illustrated in the Figures are formed in micro-channels and are therefore not readily distinguished in the illustrations. For clarity, the micro-channels in which the micro-wires are formed are labeled with corresponding numbered arrows pointing to the micro-channels; the micro-wires formed in the corresponding micro-channels are labeled with numbered lead lines touching the micro-wires.

The substrate 10 is adjacent to the bottom layer 12 so that the bottom-layer micro-wire 52 is formed in a layer adjacent to the substrate 10 and the top-layer micro-wires 22 are formed in a layer farther from the substrate 10. In such an embodiment, the bottom layer 12 and the bottom-layer micro-wire 52 is formed on or over the substrate 10; the connecting layer 14 and the connecting-layer micro-wire 32 are formed on or over the bottom layer 12 and the bottom-layer micro-wire 52; and the top layer 16 and the top-layer micro-wires 22 are formed on or over the connecting layer 14 and the connecting-layer micro-wire 32. In an embodiment, the bottom layer 12 and bottom-layer micro-wire 52 is formed first, then the connecting layer 14 and connecting-layer micro-wire 32 is formed, and then the top layer 16 and top-layer micro-wires 22 and edge micro-wire 42 are formed.

In various embodiments of the present invention, the bottom, connecting, or top layers 12, 14, 16 include common materials or are formed from common materials. In an embodiment, the bottom, connecting, or top layers 12, 14, and 16 are not distinguishable apart from the micro-channels or micro-wires formed within the bottom, connecting, or top layers 12, 14, and 16. Thus, the bottom layer 12 and connecting layer 14 form a common layer, or the connecting layer 14 and the top layer 16 form a common layer, or the bottom, connecting, and top layers 12, 14, and 16 form a common layer. In a useful embodiment, the bottom layer 12 is cross-linked to the connecting layer 14, the connecting layer 14 is cross linked to the top layer 16, or the bottom, connecting, and top layers 12, 14, and 16 are cross linked to each other. In an embodiment, the bottom layer 12, the connecting layer 14, and the top layer 16 are cured layers. For example, the bottom, connecting, and top layers 12, 14, and 16 are cured layers formed from a curable polymer that includes cross-linking agents that are cured with heat or exposure to radiation, such as ultra-violet radiation.

In further embodiments of the present invention, the bottom-layer micro-wire 52, the connecting-layer micro-wire 32, the edge micro-wire 42, or the top-layer micro-wire 22 is a cured micro-wire, for example a cured conductive ink. In an embodiment, a common conductive ink is used for any of the bottom-layer micro-wire 52, the connecting-layer micro-wire 32, the edge micro-wire 42, or the top-layer micro-wires 22 so that they include common materials or are formed from common materials. Useful, cured conductive inks can include electrically conductive particles, for example, silver nanoparticles that are sintered, welded, or agglomerated together.

In an embodiment, the connecting-layer micro-wire 32 and the bottom-layer micro-wire 52 are a common micro-wire so that electrically conductive particles in the bottom-layer micro-wire 52 are sintered, welded, or agglomerated to electrically conductive particles in the connecting-layer micro-wire 32. Such a structure is formed if the bottom-layer micro-wire 52 and the connecting-layer micro-wire 32 are coated as a curable conductive ink and at least partially cured in a common step. Alternatively, the connecting-layer micro-wire 32 and the edge micro-wire 42 are a common micro-wire so that electrically conductive particles in the connecting-layer micro-wire 32 are sintered, welded, or agglomerated to electrically conductive particles in the edge micro-wire 42. Such a structure is formed if the edge micro-wire 42 and the connecting-layer micro-wire 32 are coated as a curable conductive ink and at least partially cured in a common step. In a further embodiment, the edge micro-wire 42, the connecting-layer micro-wire 32, and the bottom-layer micro-wire 52 are a common micro-wire and include common materials.

In an embodiment, electrical connectors or connecting wires 62 are electrically connected to edge micro-wires 42 formed in the top layer 16. Such connections can provide electrical power to the bottom-layer micro-wire 52. Electrical connections can also be made to the top-layer micro-wires 22.

As illustrated in FIG. 2, the substrate 10 has at least one first substrate edge 74 and the edge area 72 is adjacent to the first substrate edge 74. A portion of the edge micro-wire 42 or multi-level micro-wire 43 forms at least a portion of a row connection pad 60A in the edge area 72. In an embodiment, a plurality of edge micro-wires 42 is electrically connected through a corresponding plurality of connecting-layer micro-wires 32 to a corresponding plurality of bottom-layer micro-wires 52. Alternatively, a plurality of multi-layer micro-wires 43 are electrically connected to a corresponding plurality of bottom-layer micro-wires 52. Similarly, the imprinted micro-wire structure of the present invention can include a plurality of top-layer micro-wires 22 electrically isolated from the edge micro-wires 42, connecting-layer micro-wires 32, and bottom-layer micro-wires 52, or the multi-layer micro-wires 43.

In another embodiment, and as illustrated in FIG. 2, the substrate 10 has at least first and second substrate edges 74, 76 and at least some of the plurality of edge micro-wires 42 are located in an edge area 72 adjacent to the first substrate edge 74 and at least some of the plurality of top-layer micro-wires 22 extend into a second edge area 73 adjacent to the second substrate edge 76 and separate from the central area 70. In such an embodiment, the edge micro-wires 42 form horizontal conductors that extend to row connection pads 60A in edge area 72 adjacent to the first substrate edge 74 and the top-layer micro-wires 22 form vertical conductors that extend to column connection pads 60B in second edge area 73 adjacent to the second substrate edge 76. As will be appreciated by those knowledgeable in the art, the relative locations of horizontal and vertical electrodes can be exchanged.

Figure 11:
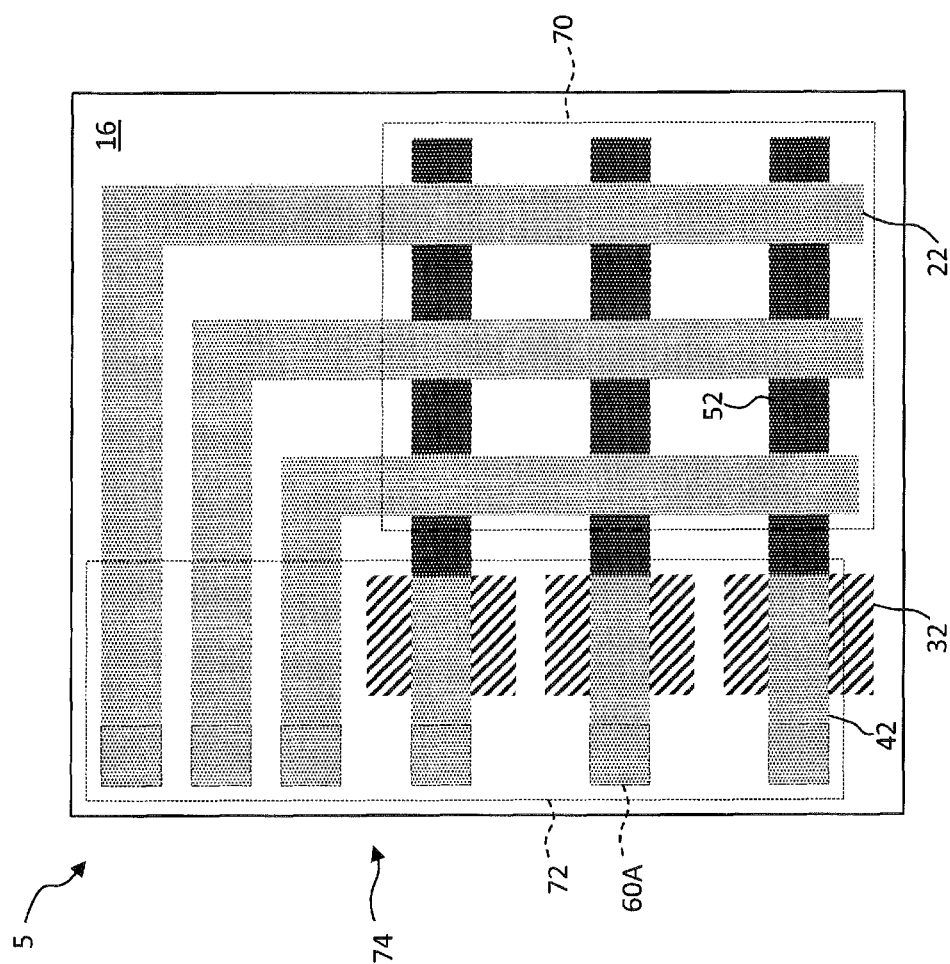
FIG. 11 is a plan view of another embodiment of the present invention corresponding to FIG. 1.
Figure 12:
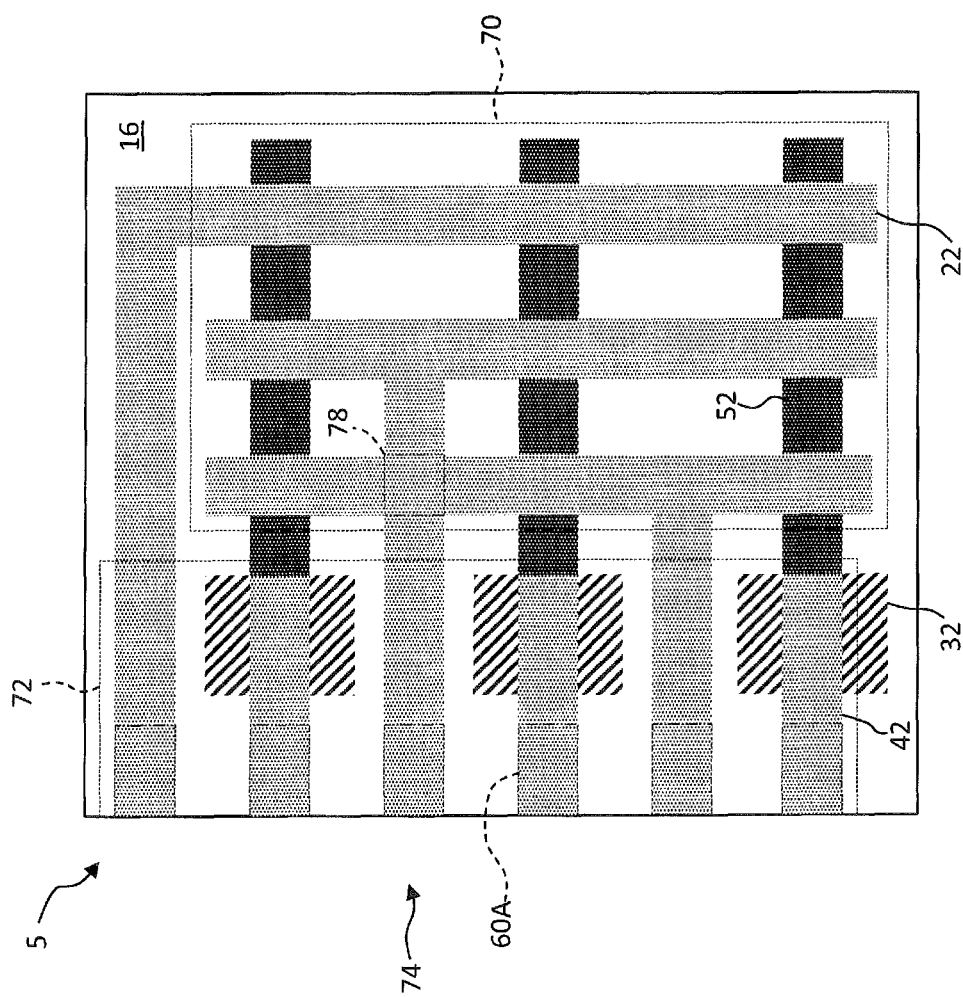
FIG. 12 is a plan view of yet another embodiment of the present invention corresponding to FIG. 1.

Referring to the plan views of FIGS. 11 and 12, an imprinted micro-wire structure 5 of the present invention includes a plurality of top-layer micro-wires 22 and edge micro-wires 42 formed in top layer 16 (or the multi-layer 15, not shown). The edge micro-wires 42 include row connection pads 60A formed in the edge area 72 separate from the central area 70. Connecting-layer micro-wires 32 electrically connect bottom-layer micro-wires 52 to the edge micro-wires 42. In this embodiment, the edge micro-wires 42 are in the edge area 72 and the top-layer micro-wires 22 also extend into the same edge area 72 adjacent to the same first substrate edge 74. By adjacent is meant that no other element is between two adjacent elements. In such an embodiment, for example, a single connector can electrically connect to both the edge micro-wires 42 and to the top-layer micro-wires 22 with row connection pads 60A. As shown in FIG. 11, the edge micro-wires 42 are adjacent to each other and the top-layer micro-wires 22 are likewise adjacent to each other. In the alternative design of FIG. 12, the edge micro-wires 42 are interdigitated between the top-layer micro-wires 22. In such an embodiment, central top-layer micro-wires 22 can cross other top-layer micro-wires 22 with a micro-wire bridge 78. Alternatively, the central top-layer micro-wires 22 can loop over the top of other top-layer micro-wires 22 and pass a second time over some of the bottom-layer micro-wires 52 before entering the edge area 72 (not shown).

Referring next to FIGS. 3A-3B, structures useful for enabling electrical contact between micro-wires in different layers are illustrated. Referring first to FIG. 3A, a portion of the edge micro-wire 42 extends primarily in a direction D2 different from the direction D1 in which at least a portion of the connecting-layer micro-wire 32 and top-layer micro-wire 22 primarily extend. In some embodiments, the direction D2 in which at least a portion of the edge micro-wire 42 primarily extends is orthogonal to the direction D1 in which at least a portion of the connecting-layer micro-wire 32 primarily extends. In another embodiment, and as is illustrated in FIG. 3A, at least a portion of the connecting-layer micro-wire 32 extends primarily in a direction D1 different from the direction D2 in which at least a portion of the bottom-layer micro-wire 52 primarily extends.

By primarily extends is meant that for micro-wires that have an aspect ratio other than one for a portion of the micro-wire, for example rectangular non-square micro-wires, the longer side of the micro-wire portion has an edge that extends in the primary direction of the micro-wire portion. Alternatively, most micro-wires are long and narrow; the length direction of the micro-wire is the direction in which the micro-wire primarily extends.

The structure in FIG. 3A is useful in preventing problems with electrical connectivity between micro-wires in different layers caused by registration or alignment tolerance requirements by extending the region over which a micro-wire in one layer can electrically contact a micro-wire in another layer. This reduces the alignment tolerance requirements for the location of micro-wires in different layers. For example, referring to FIG. 3B, if the connecting-layer micro-wire 32, edge micro-wire 42, or the bottom-layer micro-wire 52 are mis-aligned with respect to each other, electrical contact is still made between the edge micro-wire 42 and the bottom-layer micro-wire 52. As shown in FIG. 3B, the connecting-layer micro-wires 32 is mis-aligned with respect to the bottom-layer micro-wire 52, and the edge micro-wire 42 is mis-aligned with respect to the connecting-layer micro-wire 32. Despite these mis-alignments, the bottom-layer micro-wire 52 is electrically connected to the edge micro-wire 42, as desired.

Micro-wires of the present invention are not limited to rectangles. Micro-wires can be curved or form rings or waves and can also aid in connecting micro-wires in different layers in the presence of mis-alignment between micro-channels in the different layers.

Figure 13:
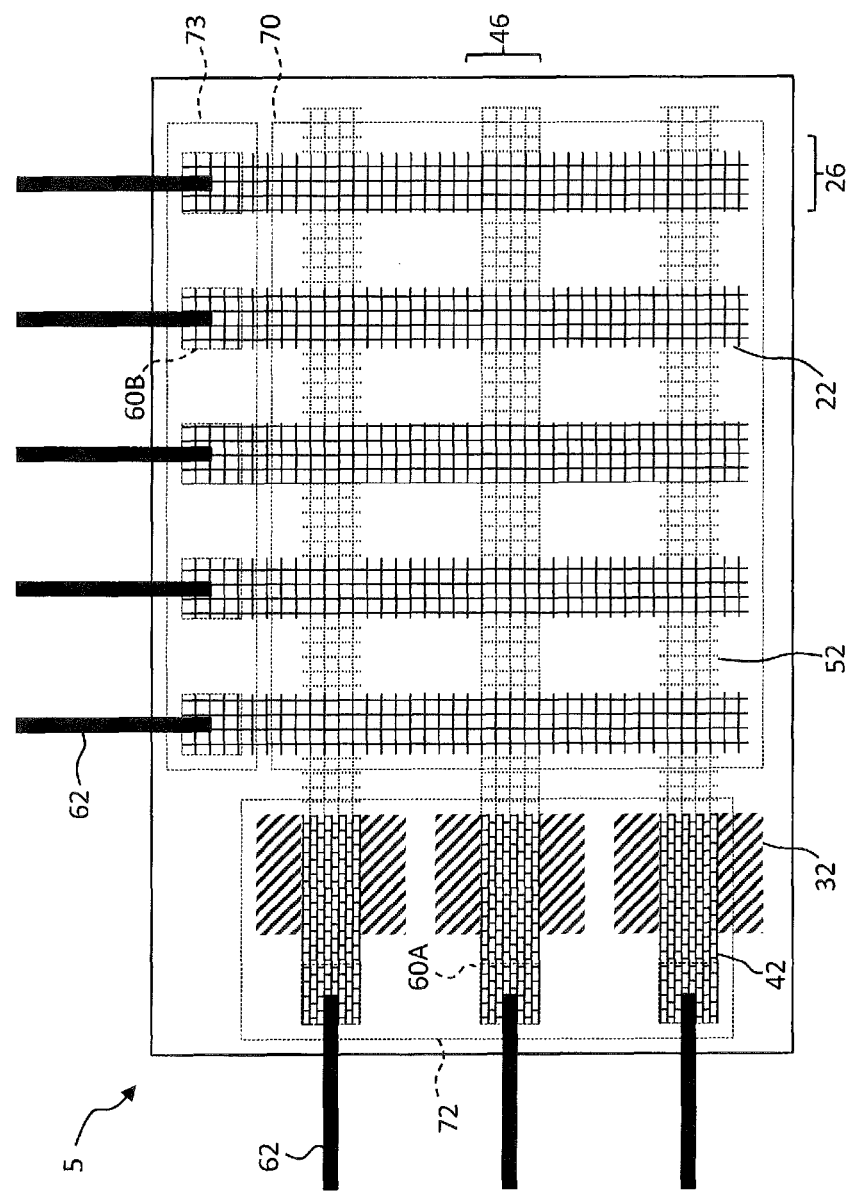
FIG. 13 is a plan view of an embodiment of the present invention.

Referring to FIG. 13, in another useful embodiment of an imprinted micro-wire structure 5, micro-wires are patterned in electrically inter-connecting grids forming apparently transparent electrodes. As shown in FIG. 13, top-layer micro-wires 22 are patterned into an electrically interconnected grid forming separate top electrodes 26. The edge micro-wires 42 and the connecting-layer micro-wires 32 can also each include a plurality of micro-wires as can the row and column connection pads 60A, 60B. Connecting wires 62 are electrically connected to each row or column connection pad 60A, 60B. Thus, bottom-layer micro-wires 52, connecting-layer micro-wires 32, and edge micro-wires 42 are patterned into an electrically interconnected grid forming separate bottom electrodes 46. The bottom electrodes 46 form row electrodes that extend from the central area 70 into the first edge area 72 with row connection pads 60A. The top electrodes 26 form column electrodes that extend from the central area 70 into the second edge area 73 with column connection pads 60B. The top and bottom electrodes 26, 46 can extend in different directions to form a two-dimensional array of overlapping micro-wire electrodes that make up an array of capacitors.

In an embodiment, the structure illustrated in FIG. 13 forms a capacitive touch screen. The bottom-layer micro-wires 52 patterned into bottom electrodes 46 and the top-layer micro-wires 22 patterned into top electrodes 26 overlap to form an array of capacitors whose capacitance is sensed through edge micro-wires 42. A controller (not shown) electrically connected to the connecting wires 62 can control the capacitive touch screen.

Figure 14:
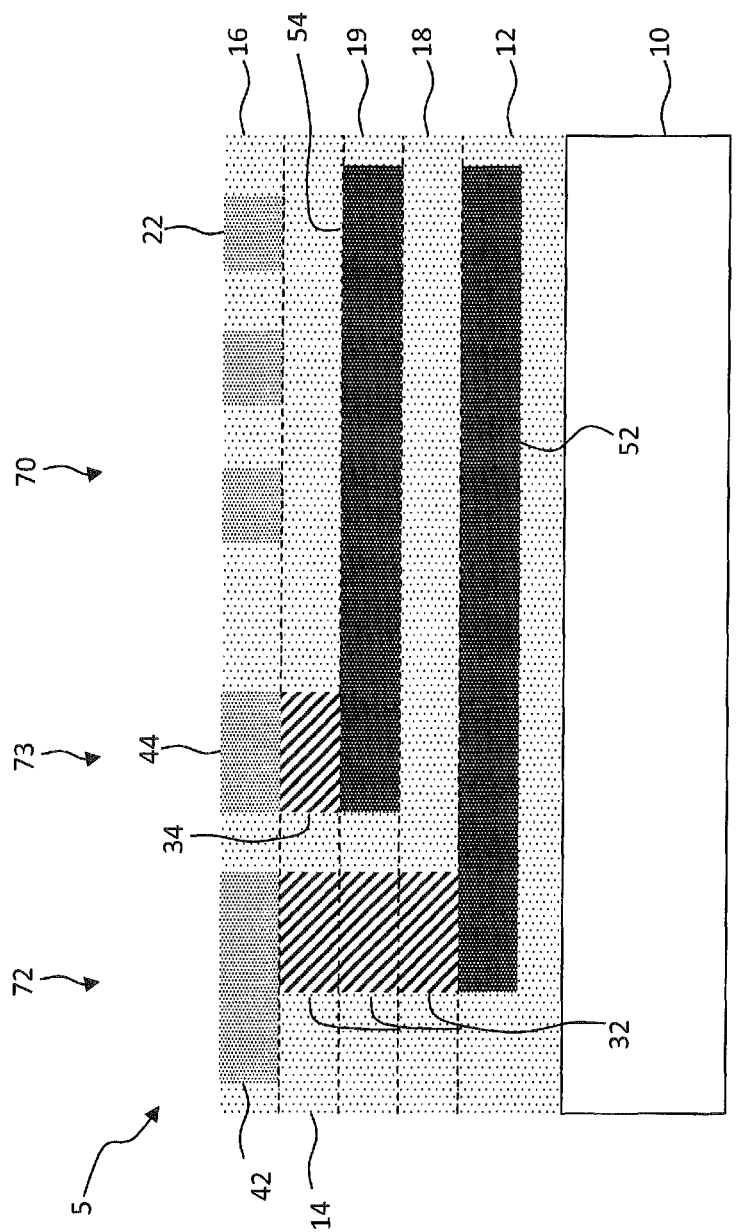
FIG. 14 is a cross section of another embodiment of the present invention.

In a further embodiment of the present invention, illustrated in FIG. 14, the multi-layer imprinted micro-wire structure 5 is extended to more than two layers. Referring to FIG. 14, a substrate 10 has the bottom layer 12 coated thereon with bottom-layer micro-wires 52 formed in the bottom layer 12. A connecting mid-layer 18 is coated over the bottom layer 12 and bottom-layer micro-wire 52 and imprinted with a stamp to form a micro-channel in contact with the bottom-layer micro-wire 52 that is filled with a connecting-layer micro-wire 32. A mid-layer 19 is coated over the connecting mid-layer 18 and imprinted with a stamp to form micro-channels that are filled to construct a mid-layer micro-wire 54 and another connecting-layer micro-wire 32. A connecting-layer 14 is coated over the mid-layer 19 and imprinted with a stamp to form micro-channels that are filled to construct a connecting-layer micro-wire 32 and another connecting mid-layer micro-wire 34. The top layer 16 is then coated over the mid-layer 19, connecting-layer micro-wire 32, and connecting mid-layer micro-wire 34, imprinted with a stamp to form micro-channels that are filled to construct the edge micro-wires 42, a second edge micro-wire 44, and top-layer micro-wires 22. Thus, electrically isolated micro-wire patterns are formed in three separate layers and each electrically connected with micro-wires in the top layer 16 to enable electrical connection to a connecting wire and controller. The edge micro-wire 42 is located in edge area 72, the second edge micro-wire 44 is located in the second edge area 73, and the top-layer micro-wires 22 are in the central area 70. Such structures can be built either with or without multi-level stamps, as discussed further below.

Figure 4:
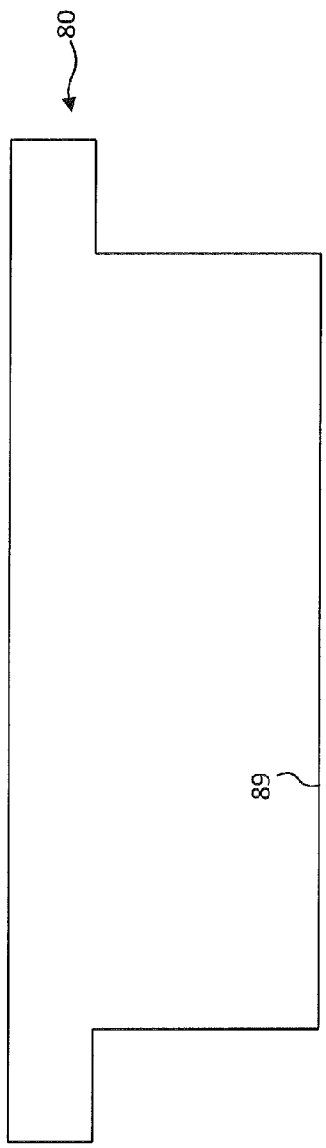
FIG. 4 is a cross section illustrating an imprinting stamp useful in a method of the present invention.
Figure 6A:
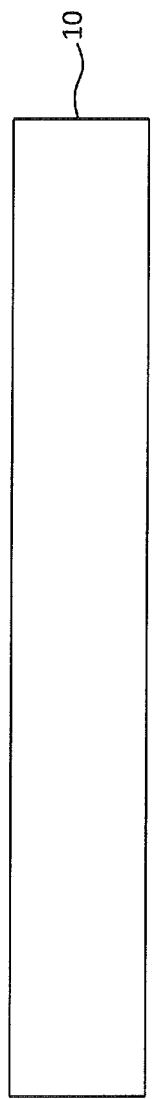
Figure 6B:
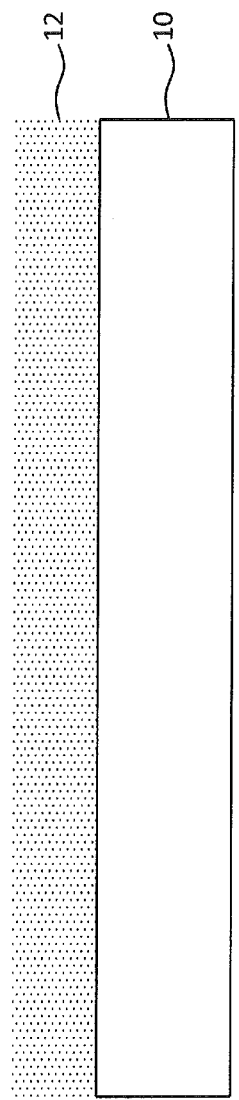
Figure 9:
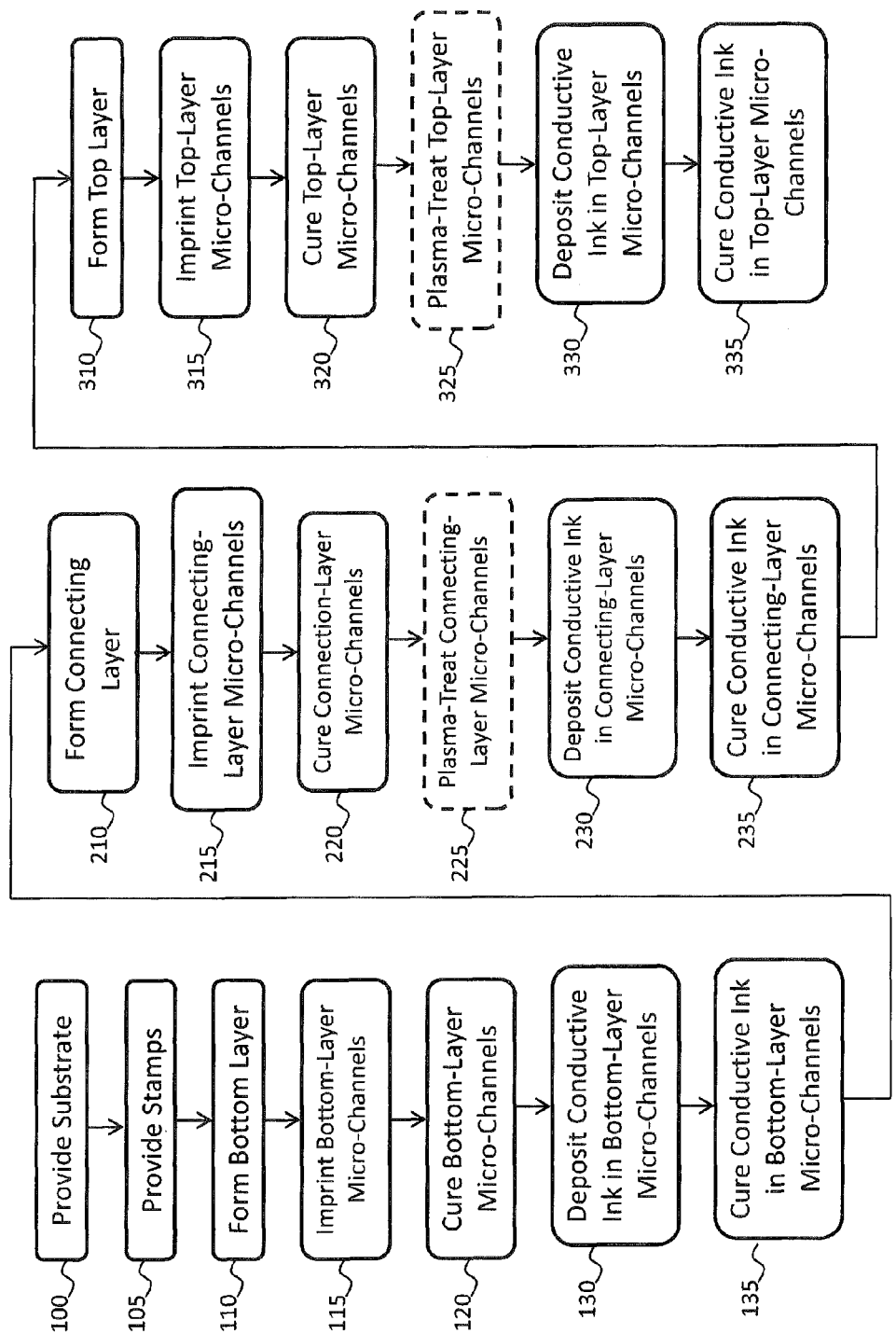
FIG. 9 is a flow diagram illustrating an embodiment of the present invention corresponding to the cross sections of FIGS. 6A-6M.

Referring to FIG. 9 and to FIGS. 6A-6M, in a method of the present invention, a substrate 10 as illustrated in FIG. 6A is provided in step 100. First, second, and third different stamps are provided in step 105. Referring also to FIG. 4, a first stamp 80 has one or more protrusions 89 that, when located in a curable layer, form micro-channels. In step 110 and as illustrated in FIG. 6B, a curable bottom layer 12 is provided in relation to the substrate 10, for example by coating a layer of curable material on the substrate 10 or on layers formed on the substrate 10.

Figure 6C:
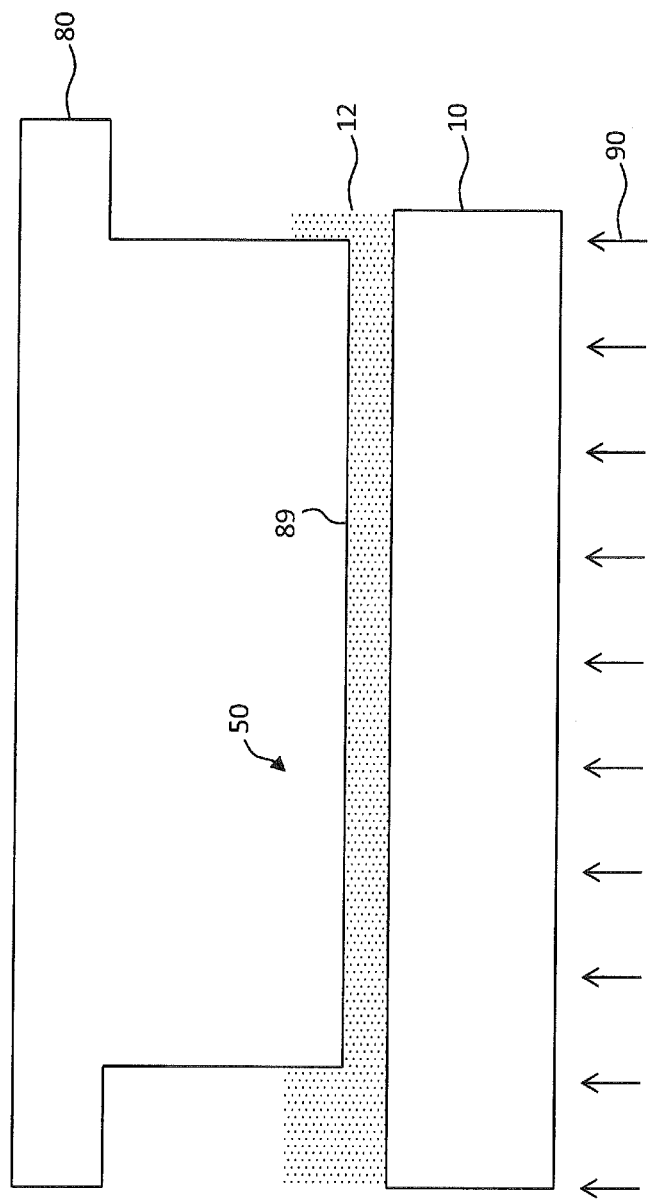

Referring next to FIG. 6C, bottom-layer micro-channel 50 is formed in the curable bottom layer 12 by at least imprinting the curable bottom layer 12 with the first stamp 80 located so that protrusion 89 extends into the curable bottom layer 12 over the substrate 10 in step 115. The curable bottom layer 12 is cured, for example with radiation 90, in step 120 and the first stamp 80 is removed from the cured bottom layer 12 (FIG. 6D) so that bottom-layer micro-channel 50 is formed in the cured bottom layer 12 over the substrate 10.

A conductive ink is provided in the bottom-layer micro-channel 50 in step 130, for example by coating the cured bottom layer 12 with conductive ink and wiping excess conductive ink from the surface of the cured bottom layer 12. The conductive ink is cured in step 135 to form a bottom-layer micro-wire 52 in the bottom-layer micro-channel 50 in cured bottom layer 12 over substrate 10, as illustrated in FIG. 6E.

Figure 6F:
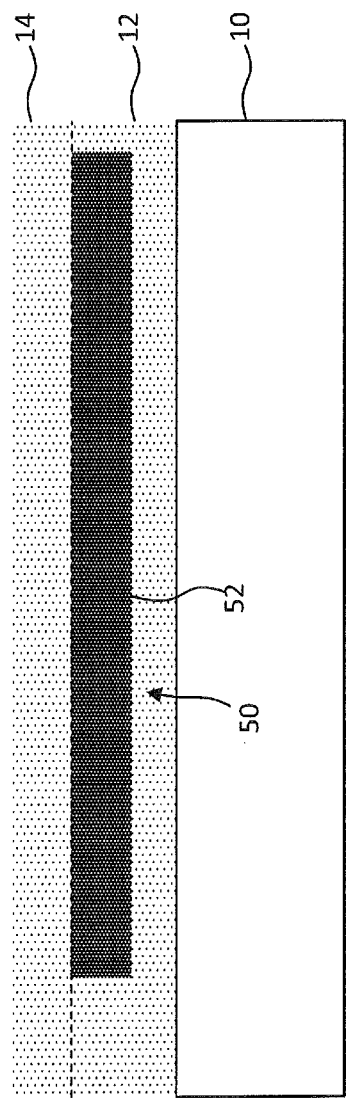
Figure 6G:
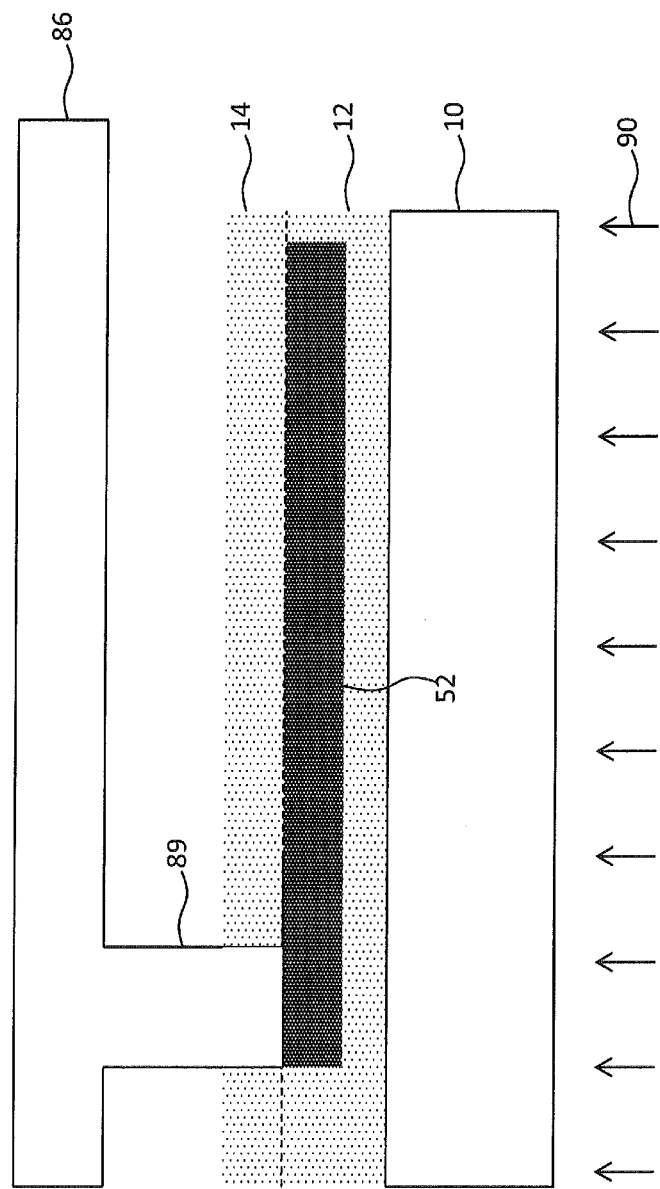

Referring to FIG. 6F, a curable connecting layer 14 is provided in step 210 adjacent to and in contact with the cured bottom layer 12 and the bottom-layer micro-wire 2 over the substrate 10. Referring to FIG. 6G, the curable connecting layer 14 is imprinted in step 215 with a second stamp 86 having a protrusion 89 located over at least a portion of the bottom-layer micro-channel 50 and bottom-layer micro-wire 52. The curable connecting layer 14 is cured in step 220, for example with radiation 90, and the second stamp 86 is removed. Referring to FIG. 6H, an imprinted connecting-layer micro-channel 30 is formed in the cured connecting layer 14 over at least a portion of the bottom-layer micro-channel 50 and the bottom-layer micro-wire 52.

A conductive ink is provided in the connecting-layer micro-channel 30 in step 230 (FIG. 9), for example by coating the cured connecting layer 14 with conductive ink and wiping excess conductive ink from the surface of the cured connecting layer 14. The conductive ink is cured in step 235 to form a connecting-layer micro-wire 32 in the connecting-layer micro-channel 30 in the cured connecting layer 14 over the cured bottom layer 12 over the substrate 10, as illustrated in FIG. 6I. The connecting-layer micro-wire 32 is in electrical contact with the bottom-layer micro-wire 52.

Figure 6J:
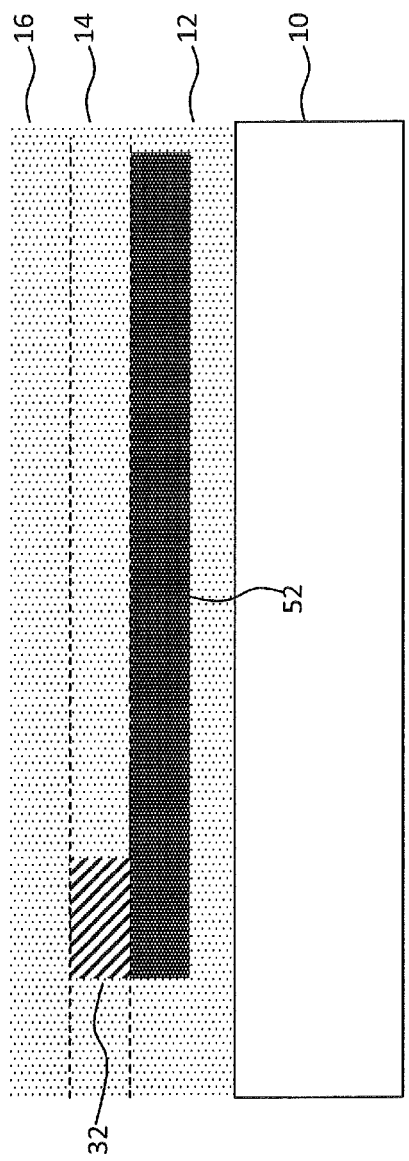
Figure 6L:
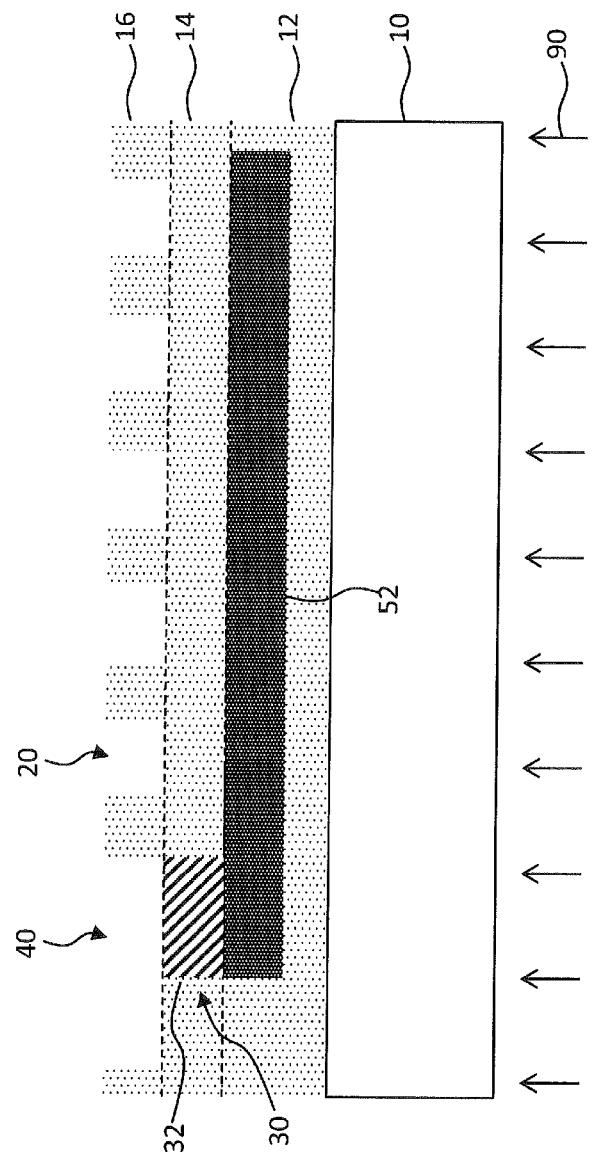

Referring next to FIG. 6J, a curable top layer 16 is provided in step 310 adjacent to and in contact with the cured connecting layer 14 and the connecting-layer micro-wire 32. The curable top layer 16 is on a side of the cured connecting layer 14 opposite the cured bottom layer 12, the bottom-layer micro-wire 52, and the substrate 10. Referring to FIG. 6K, the curable top layer 16 is imprinted in step 315 with a third stamp 87 having protrusions 89, one of which is located over at least a portion of the connecting-layer micro-channel 30 and connecting-layer micro-wire 32 forming edge micro-channel 40. One or more other protrusions 89 extend over the bottom-layer micro-wire 52 forming top-layer micro-channels 20. The curable top layer 16 is cured in step 320, for example with radiation 90, and the third stamp 87 removed. Referring to FIG. 6L, an imprinted edge micro-channel 40 is formed in cured top layer 16 over the cured connecting layer 14 and the substrate 10, over at least a portion of the connecting-layer micro-channel 30, and over at least a portion of the connecting-layer micro-wire 32. The top-layer micro-channels 20 are separate from the edge micro-channel 40 and the bottom-layer micro-wire 52 formed in the cured bottom layer 12 over the substrate 10. The edge micro-channel 40 can, but need not, extend over the bottom-layer micro-wire 52.

Figure 6M:
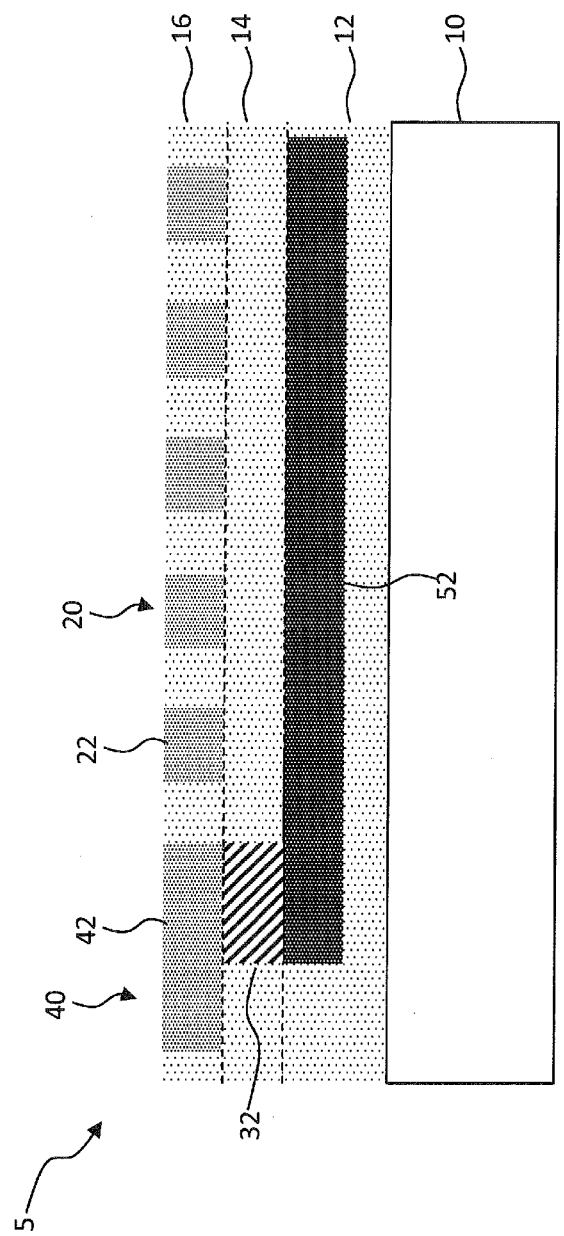

A conductive ink is provided in the edge micro-channel 40 and top-layer micro-channels 20 in step 330, for example by coating the cured top layer 16 with conductive ink and wiping excess conductive ink from the surface of the cured top layer 16. The conductive ink is cured in step 335 to form an edge micro-wire 42 in the edge micro-channel 40 and top-layer micro-wires 22 in the top-layer micro-channels 20 in the cured top layer 16 over the cured connecting layer 14 and opposite the cured bottom layer 12 and the substrate 10, as illustrated in FIG. 6M. Edge micro-wire 42 is in electrical contact with connecting-layer micro-wire 32 and bottom-layer micro-wire 52. Top-layer micro-wires 22 are electrically isolated from (not in electrical contact with) the bottom-layer micro-wire 52.

In a further embodiment of the present invention, the step 215 of forming the imprinted connecting-layer micro-channel 30 further includes contacting the bottom-layer micro-wire 52 with the second stamp 86 protrusion 89. By contacting the bottom-layer micro-wire 52 with the second stamp 86, material of the connecting layer 14 is removed from the contacted area of the connecting-layer micro-wire 32 so that the connecting-layer micro-wire 32 can electrically connect with the bottom-layer micro-wire 52. Similarly, the step 315 of forming the imprinted edge micro-channel 40 further includes contacting the connecting-layer micro-wire 32 with protrusions 89 of the imprinting third stamp 87. By contacting the connecting-layer micro-wire 32 with the imprinting third stamp 87, material of the top layer 16 is removed from the contacted area of the connecting-layer micro-wires 32 so that the connecting-layer micro-wire 32 can electrically connect with the edge micro-wire 42.

Figure 8B:
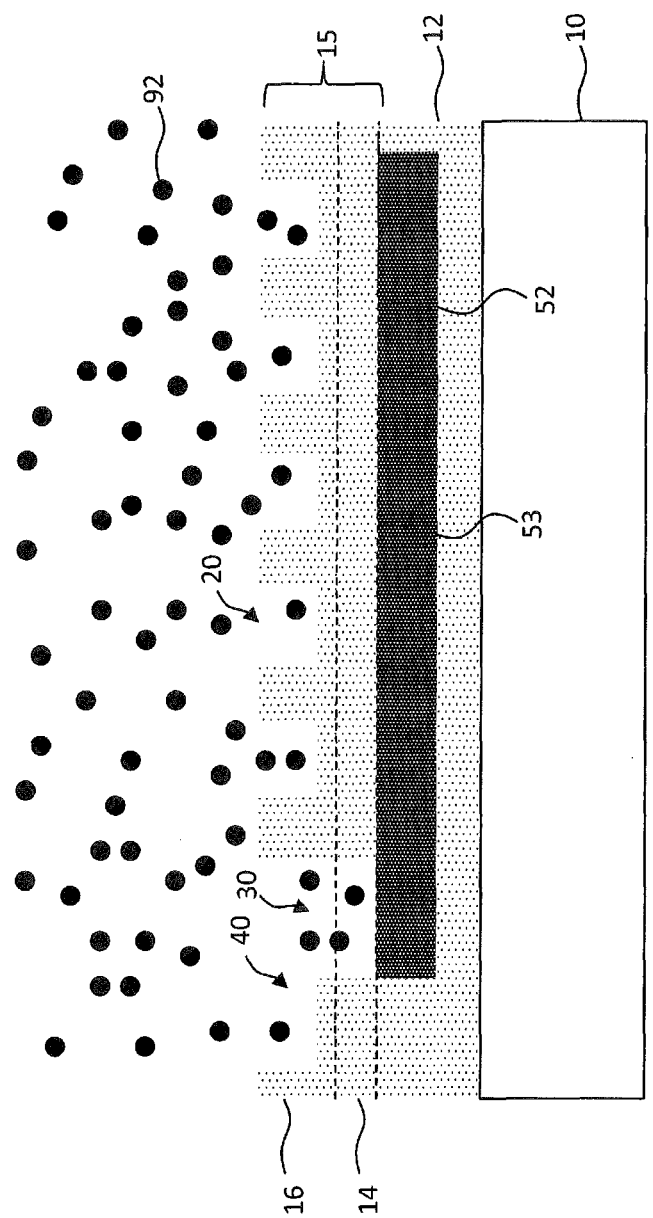

In an alternative or additional embodiment illustrated in FIGS. 8A and 8B, residual material in the connecting-layer micro-channel 30 in the connecting layer 14 (or top-layer micro-channel 20 in the top layer 16) is removed to clear the surface of the bottom-layer micro-wire 52 in the bottom layer 12. Referring to FIG. 8A, the bottom layer 12 includes the bottom-layer micro-wire 52 formed over the substrate 10. The connecting layer 14 has imprinted connecting-layer micro-channel 30 formed on the bottom layer 12 and the bottom-layer micro-wire 52. However, as shown in FIG. 8A, it is possible that material over the bottom-layer micro-wire 52 remains in the connecting-layer micro-channel 30. For example, it can be difficult to exactly locate the imprinting stamps precisely in contact with an underlying layer, or it can be preferred not to, since such contact can cause deformation of the stamp or the layer that the stamp is imprinting. If this residual material stays in place, it can prevent electrical contact between bottom-layer micro-wire 52 and subsequently formed connecting-layer micro-wire 32. Therefore, referring to FIG. 8B, an additional and optional etch step 225 is performed using a plasma 92 to etch the residual material. The plasma 92 contains oxygen as an etchant gas to remove the organic material. As shown in FIG. 8B, the plasma 92 removes a portion of the connecting layer 14 to clear the connecting-layer micro-channels 30 so that portions of the bottom-layer micro-wire 52 in the bottom layer 12 over the substrate 10 are exposed.

The plasma 92 removes a thinning depth 94 (FIG. 8A) of the entire connecting layer 14 and it is therefore helpful to remove only enough of the connecting layer 14 to clear the connecting-layer micro-channels 30 without exposing the bottom-layer micro-wire 52 to avoid an electrical short between the bottom-layer micro-wire 52 and any top-layer micro-wires 22 (not shown) formed in top-layer micro-channels 20 over the bottom-layer micro-wire 52. Thus, to prevent unwanted electrical shorts between micro-wires in adjacent layers, the thinning depth 94 is less than the difference between the depth of the cured connecting or top layers 14, 16 and the depth of any micro-channels in the corresponding cured connecting or top layer 14, 16.

The use of plasma 92 to remove a portion of a layer to clear a micro-channel can be used after any imprinting step that forms a micro-channel over an underlying micro-wire. Thus, step 225 is performed after the imprinting step 215 to clear the connecting-layer micro-channel 30 and step 325 is performed after step 315 to clear the edge micro-channel 40.

In embodiments of the present invention, the material used in any of the bottom, connecting, or top layers 12, 14, 16 are the same. The bottom, connecting, or top layers 12, 14, 16 can include cross-linking material and the material in each layer are cross linked by curing the material, for example through heat or radiation, or both.

Thus, in an embodiment, the curable bottom layer 12 includes first curable material and the first stamp 80 is located in contact with the first curable material and the first curable material is at least or only partially cured to form the bottom-layer micro-channel 50. The curable connecting layer 14 includes second curable material and the second stamp 86 is located in contact with the second curable material and the second curable material is at least or only partially cured to form the connecting-layer micro-channel 30. The curable top layer 16 includes third curable material and the third stamp 87 is located in contact with the third curable material and the third curable material is at least or only partially cured to form the edge and top-layer micro-channels 40, 20.

Furthermore, according to embodiments of the present invention, the bottom layer 12 is cross linked to the connecting layer 14 by only partially curing the bottom layer 12 in step 120 and further curing both the bottom layer 12 and the connecting layer 14 in step 220 (FIG. 9). It is also possible to cross link the connecting layer 14 to the top layer 16 by only partially curing the connecting layer 14 in step 220 and further curing both the connecting layer 14 and the top layer 16 in step 320 (FIG. 9).

When two adjacent layers include similar or the same materials and the materials in the adjacent layers are cross linked to each other, the adjacent layers can be indistinguishable or inseparable. Thus, adjacent cross-linked layers can form a single layer and the present invention includes single layers that include multiple cross-linked layers within the single layer. The multiple layers can be coated with similar materials in separate operations and then form a single layer that is cured or cross-linked in a single step.

The micro-wires in each layer can be formed by coating the layer with a conductive ink, removing excess ink from the surface of the layer, leaving ink in the micro-channels in the layer, and then curing the conductive ink to form a micro-wire. In some cases, removing excess ink from the surface of the layer can also remove ink from the micro-channels. Therefore, in a further embodiment, conductive ink is deposited in the bottom-layer micro-channel 50, the connecting-layer micro-channel 30, the edge micro-channel 40, or the top-layer micro-channels 20 a second time. Conductive ink located in a micro-channel a first time can be partially cured before locating conductive ink in the micro-channel a second time, and the conductive inks cured together in a second curing step to form a single micro-wire.

Therefore, a method of the present invention includes depositing conductive ink in the bottom-layer micro-channel 50 and at least or only partially curing the conductive ink to form the bottom-layer micro-wire 52, further includes depositing conductive ink in the connecting-layer micro-channel 30 and at least or only partially curing the conductive ink to form the connecting-layer micro-wire 32, or further includes depositing conductive ink in the edge micro-channel 40 and at least or only partially curing the conductive ink to form the edge micro-wire 42.

According to another embodiment, conductive ink located in micro-channels in different layers that are in contact are cured in a common step to form a single micro-wire that extends through multiple micro-channels and multiple layers. Thus, the edge micro-wire 42, the connecting-layer micro-wire 32, and the bottom-layer micro-wire 52 are at least partially cured in a single step to form a single micro-wire. Furthermore, if the conductive ink includes electrically conductive particles, the electrically conductive particles in the edge micro-wire 42 and the electrically conductive particles in the connecting-layer micro-wire 32 are sintered, welded, or agglomerated together in a single curing step. Similarly, electrically conductive particles in the connecting-layer micro-wire 32 are sintered, welded, or agglomerated to the electrically conductive particles in the bottom-layer micro-wire 52.

Thus, a method of the present invention can include depositing first conductive ink in the bottom-layer micro-channel 50 and only partially curing the first conductive ink to form the bottom-layer micro-wire 52, depositing second conductive ink in the connecting-layer micro-channel 30 and at least partially curing both the first and the second conductive inks at the same time to form the bottom-layer micro-wire 52 and the connecting-layer micro-wire 32. The first and second conductive inks can include electrically conductive particles and the electrically conductive particles in the first conductive ink are sintered, welded, or agglomerated to the electrically conductive particles in the second conductive ink.

Similarly, a method of the present invention includes depositing first conductive ink in the connecting-layer micro-channel 30 and only partially curing the first conductive ink to form the connecting-layer micro-wires 32, depositing second conductive ink in the edge micro-channel 40 and at least partially curing the first and the second conductive inks at the same time to form the edge micro-wire 42 and connecting-layer micro-wire 32. The first and second conductive inks can include electrically conductive particles and the electrically conductive particles in the first conductive ink are sintered, welded, or agglomerated to the electrically conductive particles in the second conductive ink.

Figure 5:
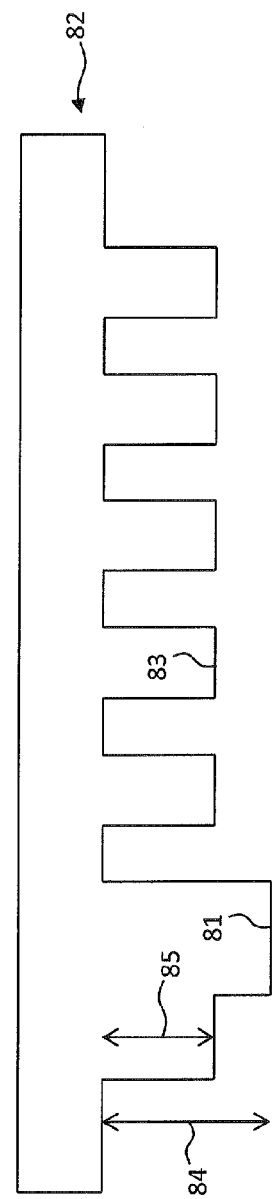
FIG. 5 is a cross section illustrating a multi-level imprinting stamp useful in a method of the present invention.

The embodiments of the present invention illustrated in FIGS. 6A-6M use three stamps to imprint three layers of micro-channels in three steps as well as using three separate steps to form the micro-wires in the micro-channels formed in the various layers. According to another embodiment of the present invention, a multi-level second stamp 82 illustrated in FIG. 5 is used to form two levels of the imprinted micro-wire structure 5 in a single, common step at the same time. Referring to FIG. 5, a multi-level second stamp 82 has at least one deep protrusion 81 having a deep-protrusion depth 84 and at least one shallow protrusion 83 having a shallow-protrusion depth 85. The deep-protrusion depth 84 is greater than the shallow-protrusion depth 85 so that when the multi-level second stamp 82 is used to imprint a pattern in a layer, the portion of the pattern corresponding to the deep protrusion 81 is deeper than the portions of the pattern corresponding to the shallow protrusions 83.

Figure 10:
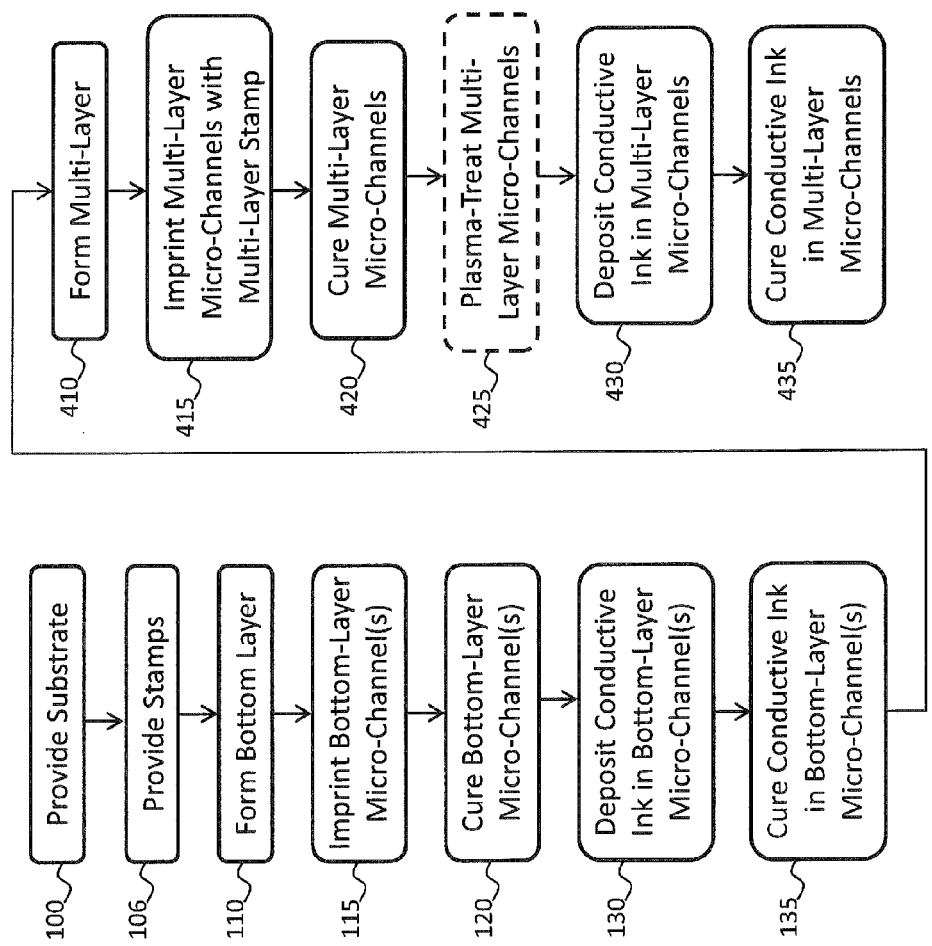
FIG. 10 is a flow diagram illustrating an embodiment of the present invention corresponding to the cross sections of FIGS. 7A-7I.

Referring to FIGS. 7A-7I and to FIG. 10, another method of making an imprinted micro-wire structure 5 corresponding to FIG. 1 includes providing a substrate 10 (FIG. 7A) in step 100. A first stamp 80 and a different multi-level second stamp 82 are provided in step 106, the multi-level second stamp 82 having at least one deep protrusion 81 and one or more shallow protrusions 83, the first and second deep protrusions 81 having a deep-protrusion depth 84 greater than a shallow-protrusion depth 85 of the shallow protrusion(s) 83, as illustrated in FIG. 5.

Figure 7A:
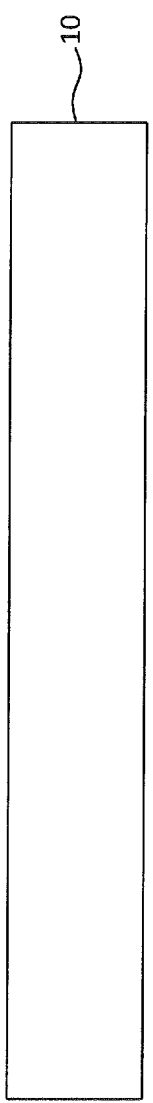
FIGS. 7A-7I are cross sections illustrating sequential steps in an alternative method of the present invention that forms the multi-wire structure of FIG. 1.
Figure 7B:
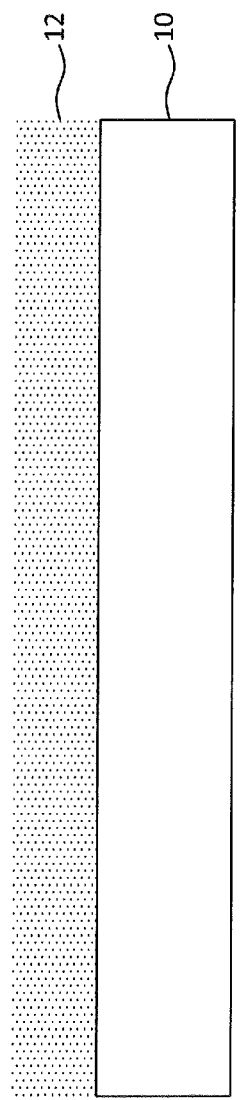
Figure 7C:
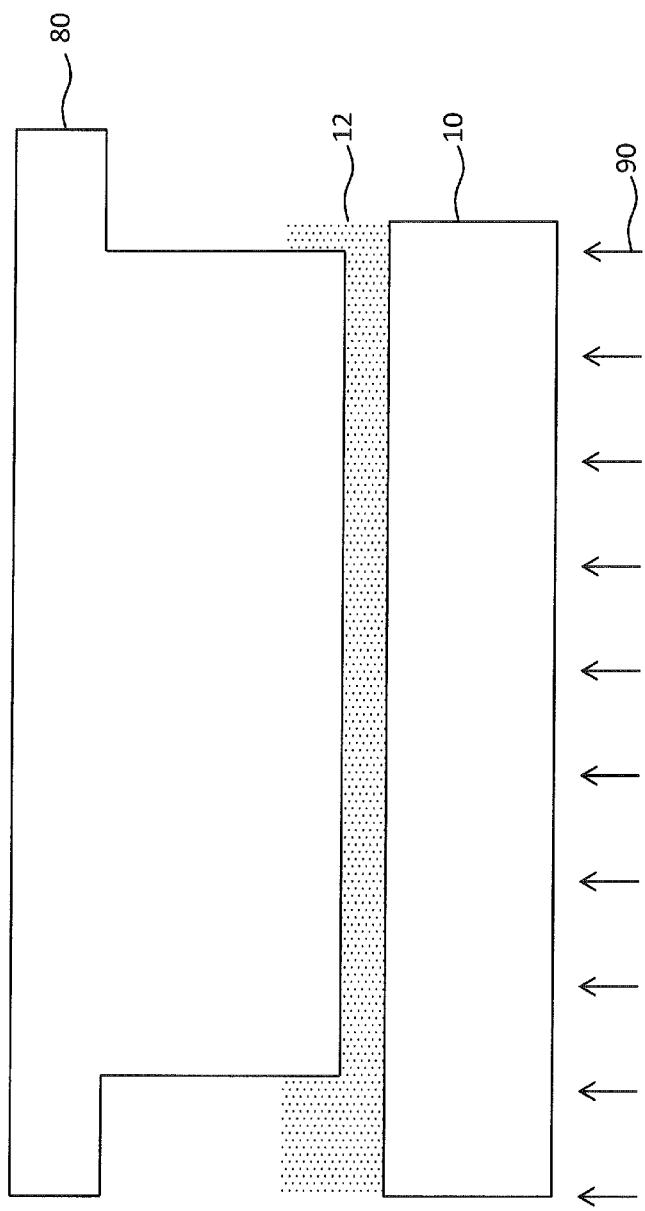
Figure 7D:
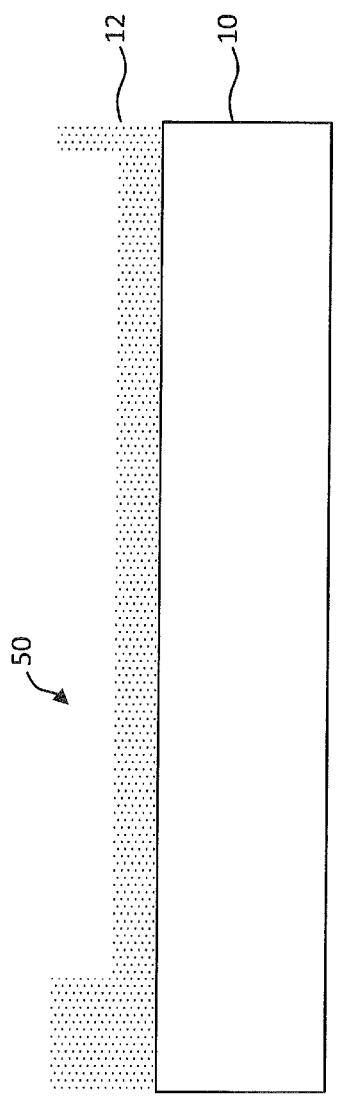
Figure 7E:
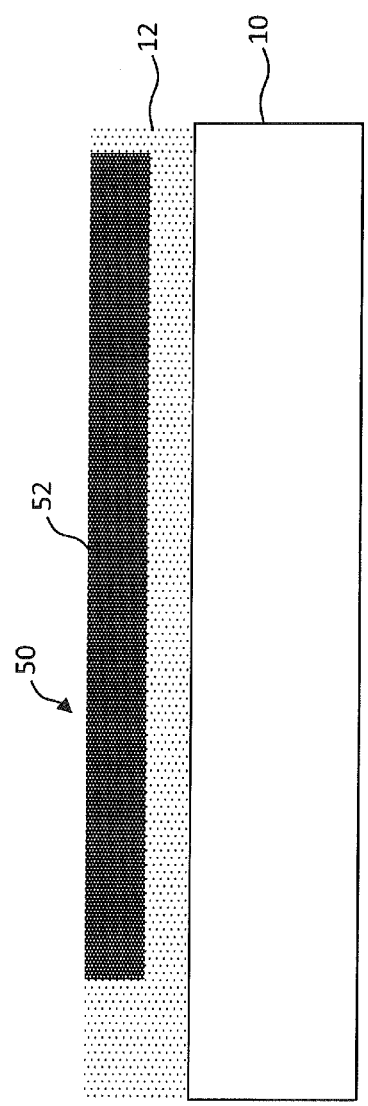
Figure 7F:
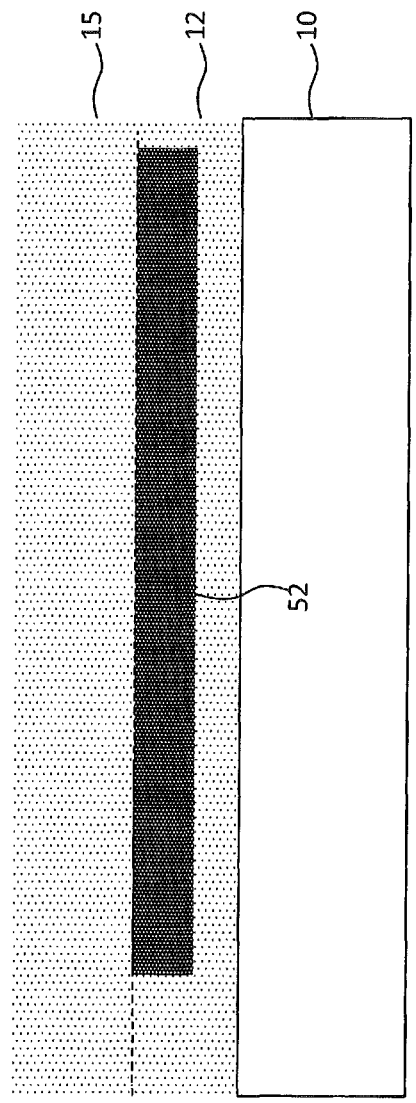
Figure 7G:
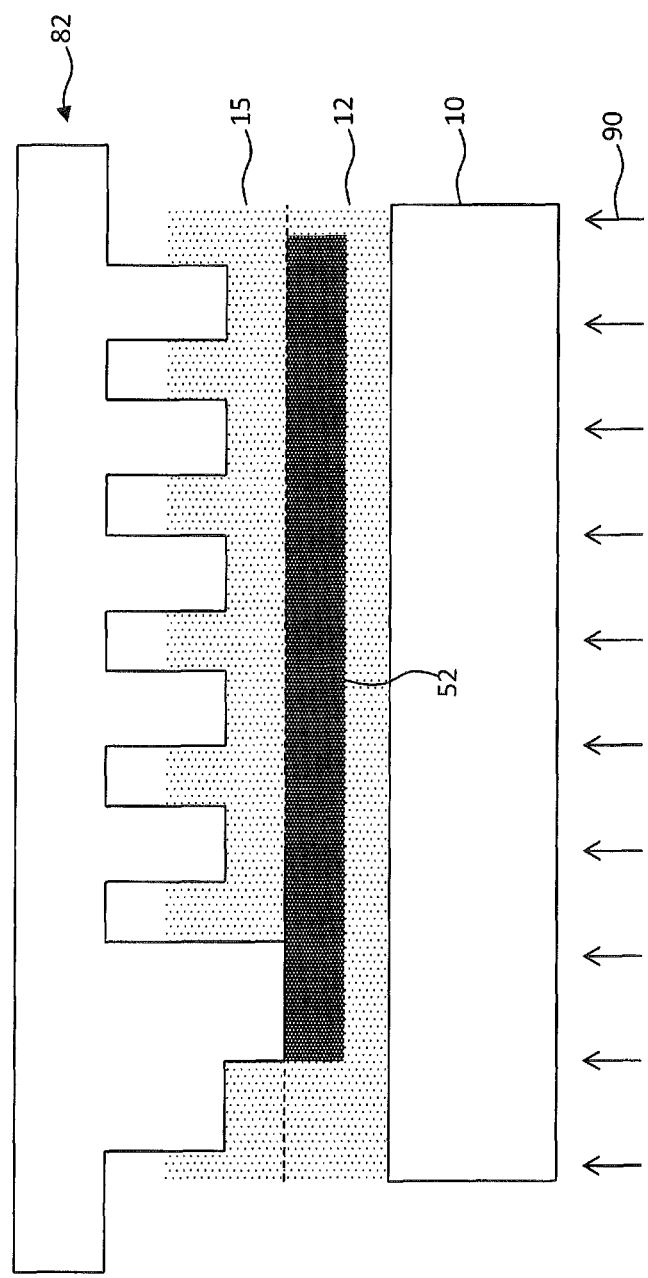

A curable bottom layer 12 is formed over the substrate 10 in step 110 (FIG. 7B). The curable bottom layer 12 on the substrate 10 is imprinted with the first stamp 80 (step 115) and cured (step 120), for example with radiation 90, as illustrated in FIG. 7C to form the bottom-layer micro-channel 50 in the curable bottom layer 12 on substrate 10 (FIG. 7D).

Conductive ink is deposited in the bottom-layer micro-channels 50 (step 130) and cured (step 135), forming the bottom-layer micro-wire 52 in the bottom-layer micro-channel 50 in the bottom layer 12 (FIG. 7E) over the substrate 10.

A curable multi-layer 15 is formed adjacent to and in contact with the cured bottom layer 12 and the bottom-layer micro-wire 52 over the substrate 10 in step 410 (FIG. 7F), for example by coating. In this embodiment, the multi-layer 15 is a single layer that forms both the connecting layer 14 and the top layer 16 of FIG. 1, and the corresponding structures in the connecting layer and the top layer 14, 16 are made in common steps.

Figure 7H:
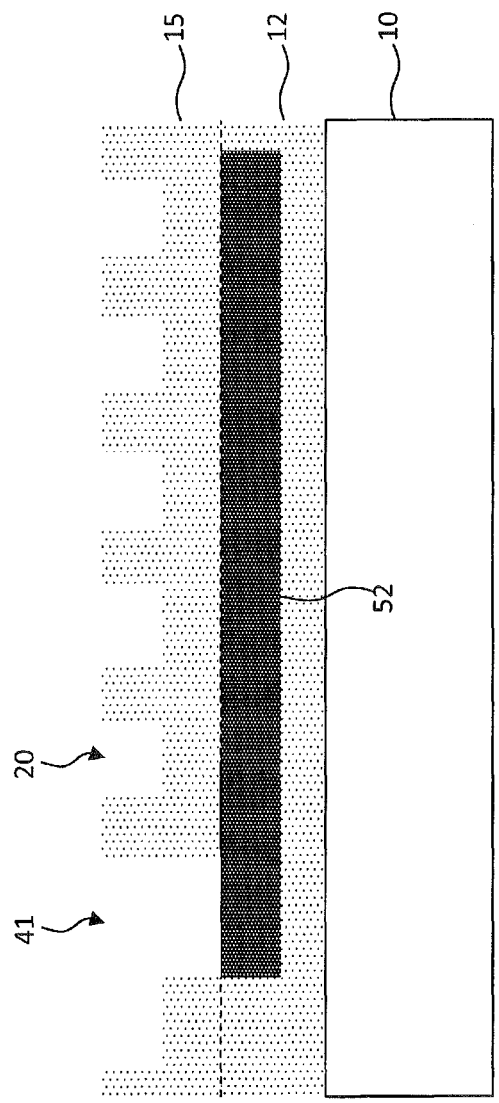

The curable multi-layer 15 is imprinted with the multi-level second stamp 82 in step 415 and cured in step 420 (FIG. 7G), for example with radiation 90. The imprinting is done over the bottom-layer micro-wire 52 in the bottom layer 12 and over the substrate 10. Referring also to FIG. 7H, a multi-layer micro-channel 41 and a top-layer micro-channel 20 in the curable multi-layer 15 are formed in a common step by imprinting with the multi-level second stamp 82. The multi-layer micro-channel 41 includes the edge micro-channel 40 of FIG. 1 and the connecting-layer micro-channel 30 of FIG. 1. Although in the method described with respect to FIGS. 6A-6M, the edge micro-channel 40 and the connecting-layer micro-channel 30 are formed in separate steps and form separate structures, in the method of FIGS. 7A-7I, the edge micro-channel 40 and the connecting-layer micro-channel 30 are formed as a single multi-layer micro-channel 41 in a single step.

The portion of the multi-layer micro-channel 41 formed by the deep protrusion 81 of the multi-level second stamp 82 is located over and in contact with at least a portion of the bottom-layer micro-wire 52. The top-layer micro-channels 20 formed by the shallow protrusions 83 of the multi-level second stamp 82 extend over at least a portion of the bottom-layer micro-wire 52 without contacting the bottom-layer micro-wire 52.

Figure 7I:
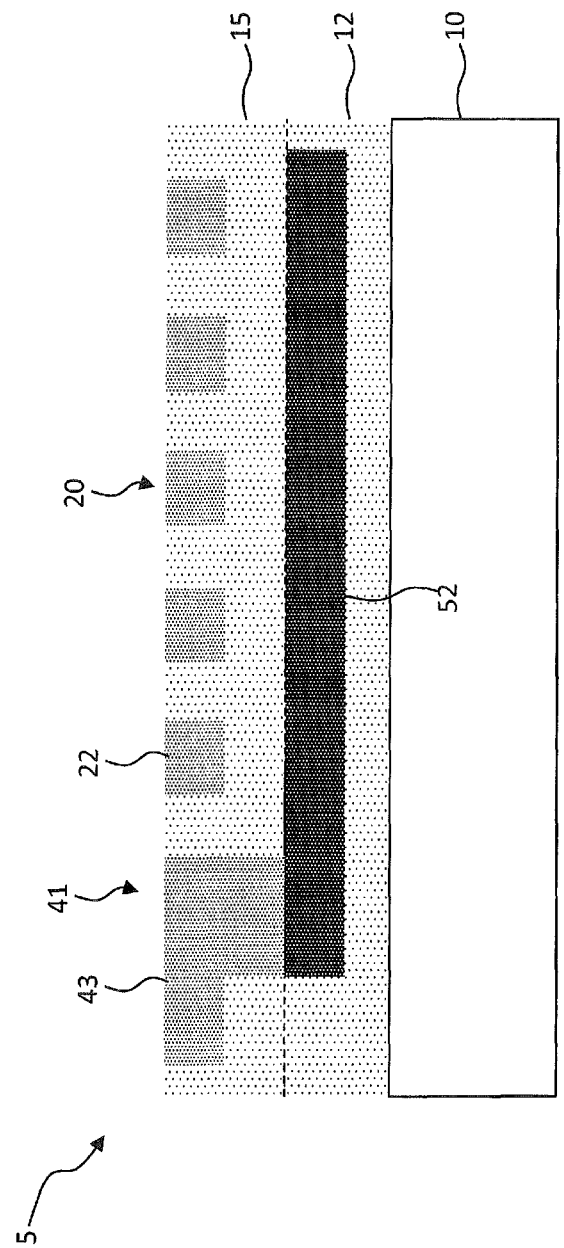

Conductive ink is deposited in the multi-layer micro-channel 41 and top-layer micro-channel 20 (step 430) and cured (step 435), forming an imprinted micro-wire structure 5 having a top-layer micro-wire 22 in the top-layer micro-channel 20 and a multi-layer micro-wire 43 in the multi-layer micro-channel 41, as shown in FIG. 7I. The top-layer micro-wire 22 is electrically isolated from the multi-layer micro-wire 43 and the bottom-layer micro-wire 52. The bottom-layer micro-wire 52 is electrically connected to the multi-layer micro-wire 43 (that includes the edge micro-wire 42 and connecting-layer micro-wire 32 of FIG. 1).

In one embodiment, the step 415 of forming the imprinted multi-layer micro-channel 41 includes contacting the bottom-layer micro-wire 52 with the deep protrusion 81 of the multi-level second stamp 82.

Referring to FIGS. 8A and 8B in further embodiments of the present invention relevant to the structures and method of FIGS. 7A-7I, a portion of the cured multi-layer 15 is removed before the multi-layer 15 is coated, for example by treating (step 425) the portion of the cured multi-layer 15 with plasma 92. The treatment can thin the entire cured multi-layer 15 by a thinning depth less than the deep-protrusion depth 84 of the deep protrusion minus the shallow-protrusion depth 85 of the shallow protrusion.

In other embodiments, the bottom layer 12 and multi-layer 15 include cross-linkable material and the cross-linkable bottom-layer material is cross-linked to the cross-linkable multi-layer material, for example by UV exposure to resins as is known in the art. Such cross-linking between the layers is accomplished when the curable bottom layer 12 includes first curable material and the first stamp 80 is located in contact with the first curable material. The first curable material is at least or only partially cured so that when the curable multi-layer 15 includes second curable material and the multi-level second stamp 82 is located in contact with the second curable material, the step of at least partially curing the second curable material can also at least partially cure the first material and cross link the first and second curable materials in a common step. Such partial curing of individual curable material layers followed by curing multiple curable material layers together can form a single indistinguishable or inseparable layer, especially when the first and second materials are the same material, thus providing a stronger and more robust layer structure.

In a further embodiment, conductive ink is deposited in the multi-layer micro-channel 41 and the top-layer micro-channels 20 in a common step. In an alternative embodiment, conductive ink is deposited in the bottom-layer micro-channel 50, the multi-layer micro-channel 41, or top-layer micro-channels 20 a second time and cured.

Furthermore, first conductive ink is deposited in the bottom-layer micro-channel 50 and at least or only partially cured. Second conductive ink is deposited in the multi-layer micro-channel 41 and top-layer micro-channels 20. The first conductive ink in the bottom-layer micro-channel 50 is at least partially cured in a common step with the second conductive ink in the multi-layer micro-channel 41.

The first and second conductive inks can each include electrically conductive particles. In a further embodiment, the electrically conductive particles in the second conductive ink are sintered, welded, or agglomerated to the electrically conductive particles in the first conductive ink, thus improving their conductivity and the electrical conductivity of the junctions between the different-layer micro-wires. Indeed, the micro-wires in the different layers can be considered as a common micro-wire.

In an embodiment, a cured-layer depth of the bottom layer 12, connecting layer 14, or top layer 16 has a range of about one micron to twenty microns and a cured-layer depth of the multi-layer 15 has a range of about 2 microns to 30 microns.

Cured bottom layer 12, connecting layer 14, top layer, 16, or multi-layer 15 is a layer of curable material that has been cured and, for example, formed of a curable material coated or otherwise deposited on a surface, for example a surface of substrate 10, to form a curable layer. The substrate-coated curable material is considered herein to be curable layer before it is cured and a cured layer after it is cured. Similarly, a cured electrical conductor is an electrical conductor formed by locating a curable material in a micro-channel and curing the curable material to form the cured electrical conductor in the micro-channel. The cured electrical conductor is a micro-wire.

In various embodiments, curable layers are deposited as a single layer in a single step using coating methods known in the art, e.g. curtain coating. In an alternative embodiment, curable layers are deposited as multiple sub-layers using multi-layer deposition methods known in the art, e.g. multi-layer slot coating, repeated curtain coatings, or multi-layer extrusion coating. In yet another embodiment, curable layers include multiple sub-layers formed in different, separate steps, for example with a multi-layer extrusion, curtain coating, or slot coating as is known in the coating arts. Micro-channels are embossed and cured in curable layers in a single step and micro-wires are formed by depositing a curable conductive ink in micro-channels and curing the curable conductive ink to form an electrically conductive micro-wire.

Cured layers (e.g. bottom, connecting, or top layers 12, 14, 16, or multi-layer 15) useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated, for example with exposure to radiation or heat. When a molding device, such as the first stamp 80 or multi-level second stamp 82 having an inverse micro-channel structure is applied to liquid curable material in a curable layer coated on the substrate 10 and the cross-linking agents in the curable material are activated, the liquid curable material in the curable layer is hardened into a cured layer having micro-channels with the inverse structure of the stamp. The liquid curable materials can include a surfactant to assist in controlling coating. Materials, tools, and methods are known for embossing coated liquid curable materials to form cured layers having conventional single-layer micro-channels.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels and cured, for example by heating or exposure to radiation such as infra-red, visible light, or ultra-violet radiation. The curable ink hardens to form the cured ink that makes up micro-wires. For example, a curable conductive ink with conductive nano-particles is located within micro-channels and heated to agglomerate or sinter the nano-particles, thereby forming an electrically conductive micro-wire. Materials, tools, and methods are known for coating liquid curable inks to form micro-wires in conventional single-layer micro-channels. The curable conductive ink is not necessarily electrically conductive before it is cured.

It has been experimentally demonstrated that micro-channels having a width of four microns formed in a cured layer with a depth having a range of about four microns to twelve microns over a conductive layer can be filled with liquid curable conductive inks containing silver nano-particles and cured with heat to form micro-wires that conduct-electricity to the conductive layer, thus enabling electrical conduction between separate micro-wires in a cured layer through the conductive layer. Oxygen plasmas that thin the cured layer by two to eight microns have been shown to enable the formation of micro-wires that are in electrical contact with the underlying conductive layer. It has also been experimentally demonstrated that micro-wires formed in a micro-channel in a bottom layer can be contacted with a micro-wire formed in a micro-channel in a layer coated over the bottom layer to form an electrically continuous conductive micro-structure.

According to various embodiments of the present invention, substrate 10 is any material having a surface on which a cured layer can be formed. Substrate 10 can be a rigid or a flexible substrate made of, for example, a glass, metal, plastic, or polymer material, can be transparent, and can have opposing substantially parallel and extensive surfaces. Substrates 10 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

Substrate 10 can be an element of other devices, for example the cover or substrate of a display or a substrate, cover, or dielectric layer of a touch screen. In an embodiment, a substrate 10 of the present invention is large enough for a user to directly interact therewith, for example using an implement such as a stylus or using a finger or hand. Methods are known in the art for providing suitable surfaces on which to coat a single curable layer. In a useful embodiment, substrate 10 is substantially transparent, for example having a transparency of greater than 90%, 80% 70% or 50% in the visible range of electromagnetic radiation.

Electrically conductive micro-wires and methods of the present invention are useful for making electrical conductors and busses for transparent micro-wire electrodes and electrical conductors in general, for example as used in electrical busses. A variety of micro-wire or micro-channel patterns can be used and the present invention is not limited to any one pattern. Micro-wires can be spaced apart, form separate electrical conductors, or intersect to form a mesh electrical conductor on or in a layer. Micro-channels can be identical or have different sizes, aspect ratios, or shapes. Similarly, micro-wires can be identical or have different sizes, aspect ratios, or shapes. Micro-wires can be straight or curved.

In some embodiments, a micro-channel is a groove, trench, or channel formed in a cured layer and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Micro-channels can have a rectangular cross section, as shown in the Figures. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In various embodiments of the present invention, micro-channels or micro-wires have a width less than or equal to 10 microns, 5 microns, 4 microns, 3 microns, 2 microns, or 1 micron. In an example and non-limiting embodiment of the present invention, each micro-wire is from 10 to 15 microns wide, from 5 to 10 microns wide, from one micron to five microns wide or from one/half micron to one micron wide. In some embodiments, micro-wires can fill micro-channels; in other embodiments micro-wires do not fill micro-channels. In an embodiment, micro-wires are solid; in another embodiment micro-wires are porous.

Micro-wires can include metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials can be used. Alternatively, micro-wires can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires of the present invention can be operated by electrically connecting-layer micro-wires through connection pads and electrical connectors to electrical circuits that provide electrical current to micro-wires and can control the electrical behavior of micro-wires. Electrically conductive micro-wires of the present invention are useful, for example in touch screens such as projected-capacitive touch screens that use transparent micro-wire electrodes and in displays. Electrically conductive micro-wires can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 direction
D2 direction
5 imprinted micro-wire structure
10 substrate
12 bottom layer
14 connecting layer
15 multi-layer
16 top layer
18 connecting mid-layer
19 mid-layer
20 top-layer micro-channel
22 top-layer micro-wire
26 top electrode
30 connecting-layer micro-channel
32 connecting-layer micro-wire
34 connecting mid-layer micro-wire
40 edge micro-channel
41 multi-layer micro-channel
42 edge micro-wire
43 multi-layer micro-wire
44 second edge micro-wire
46 bottom electrode
50 bottom-layer micro-channel
52 bottom-layer micro-wire
54 mid-layer micro-wire
60A row connection pad
60B column connection pad
62 connecting wire
70 central area
72 edge area
73 second edge area
74 first substrate edge
76 second substrate edge
78 micro-wire bridge
80 first stamp
81 deep protrusion
82 multi-level second stamp
83 shallow protrusion
84 deep-protrusion depth
85 shallow-protrusion depth
86 second stamp
87 third stamp
89 protrusion
90 radiation
92 plasma
94 thinning depth
100 provide substrate step
105 provide stamps step
106 provide stamps step
110 form bottom layer step
115 imprint bottom-layer micro-channels step
120 cure bottom-layer micro-channels step
130 deposit conductive ink in bottom-layer micro-channels step
135 cure conductive ink in bottom-layer micro-channels step
210 form connecting layer step
215 imprint connecting-layer micro-channels step
220 cure connecting-layer micro-channels step
225 optional plasma-treat connecting-layer micro-channels step
230 deposit conductive ink in connecting-layer micro-channels step
235 cure conductive ink in connecting-layer micro-channels step
310 form top layer step
315 imprint top-layer micro-channels step
320 cure top-layer micro-channels step
325 optional plasma-treat top-layer micro-channels step
330 deposit conductive ink in edge and top-layer micro-channels step
335 cure conductive ink in top-layer micro-channels step
410 form multi-layer step

415 imprint multi-layer micro-channels with multi-level stamp step
420 cure multi-layer micro-channels step
425 optional plasma-treat multi-layer micro-channels step
430 deposit conductive ink in multi-layer micro-channels step
435 cure conductive ink in multi-layer micro-channels step

The invention claimed is:

1. An imprinted micro-wire structure, comprising:
a substrate having an edge area and a central area separate from the edge area;
a cured bottom layer formed on the substrate, the cured bottom layer having an edge area and a central area corresponding respectively to the edge area and the central area of the substrate;
an imprinted bottom-layer micro-channel in the cured bottom layer in at least a portion of the central area and in at least a portion of the edge area, the bottom-layer micro-channel extending from the central area into the edge area;
a cured bottom-layer micro-wire located in the bottom-layer micro-channel, the bottom-layer micro-wire extending from the central area into the edge area;
a cured connecting layer adjacent to and in contact with the cured bottom layer and the bottom-layer micro-wire;
an imprinted connecting-layer micro-channel in the cured connecting layer over at least a portion of the bottom-layer micro-channel in at least a portion of the edge area;
a cured connecting-layer micro-wire located in the connecting-layer micro-channel contacting at least a portion of the bottom-layer micro-wire;
a cured top layer adjacent to and in contact with the cured connecting layer and the connecting-layer micro-wire, the cured top layer having an edge area and a central area corresponding respectively to the edge area and the central area of the substrate;
an imprinted edge micro-channel in the cured top layer in at least a portion of the edge area and an imprinted top-layer micro-channel in the cured top layer separate from the bottom-layer micro-channel and over at least a portion of the bottom-layer micro-channel in at least a portion of the central area;
an edge micro-wire located in the edge micro-channel contacting at least a portion of the connecting-layer micro-wire and a top-layer micro-wire located in the top-layer micro-channel that is electrically isolated from the edge micro-wire, the connecting-layer micro-wire, and the bottom-layer micro-wire; and
wherein the bottom-layer micro-wire in the central area is electrically connected to the edge micro-wire in the edge area and is electrically isolated from the top-layer micro-wire.

2. The imprinted micro-wire structure of claim 1, wherein the substrate has at least one edge and the edge area is adjacent to the edge.

3. The imprinted micro-wire structure of claim 1, wherein a portion of the edge micro-wire forms at least a portion of a connection pad.

4. The imprinted micro-wire structure of claim 3, wherein the connection pad further includes a plurality of micro-wires.

5. The imprinted micro-wire structure of claim 1, further including a plurality of edge micro-wires electrically connected through a corresponding plurality of connection micro-wires to a corresponding plurality of bottom-layer micro-wires.

6. The imprinted micro-wire structure of claim 5, further including a plurality of top-layer micro-wires electrically isolated from the edge micro-wires.

7. The imprinted micro-wire structure of claim 6, wherein the top-layer micro-wires and the bottom-layer micro-wires form a two-dimensional array of overlapping micro-wires.

8. The imprinted micro-wire structure of claim 6, wherein the substrate has at least first and second edges and at least some of the plurality of edge micro-wires are located in an edge area adjacent to the first edge and at least some of the plurality of top-layer micro-wires extend into a second edge area adjacent to the second edge and separate from the central area.

9. The imprinted micro-wire structure of claim 8, wherein the edge micro-wires are in the edge area and the top-layer micro-wires extend into the edge area.

10. The imprinted micro-wire structure of claim 9, wherein portions of the top-layer micro-wires are interdigitated between the edge micro-wires in the edge area.

11. The imprinted micro-wire structure of claim 1, wherein at least two of the layers including the bottom layer, the connecting layer, and the top layer includes at least the same material.

12. The imprinted micro-wire structure of claim 1, wherein the bottom layer is cross linked to the connecting layer or the connecting layer is cross-linked to the top layer.

13. The imprinted micro-wire structure of claim 1, wherein the connecting layer and top layer are not distinguishable apart from the connecting-layer micro-channel and the top-layer micro-channel or the connecting-layer micro-wire and the top-layer micro-wire.

14. The imprinted micro-wire structure of claim 1, wherein the bottom-layer micro-wire, connecting micro-wire, or top-layer micro-wire is a cured micro-wire.

15. The imprinted micro-wire structure of claim 1, wherein at least two of the micro-wires including the bottom-layer micro-wire, the connecting micro-wire, and the top-layer micro-wire includes at least the same.

16. The imprinted micro-wire structure of claim 1, wherein any of the bottom-layer micro-wire, connecting micro-wire, or top-layer micro-wire includes a cured conductive ink.

17. The imprinted micro-wire structure of claim 10, wherein any of the bottom-layer micro-wire, connecting micro-wire, or top-layer micro-wire includes electrically conductive particles.

18. The imprinted micro-wire structure of claim 11, wherein electrically conductive particles in the bottom-layer micro-wire are sintered, welded, or agglomerated to electrically conductive particles in the connecting-layer micro-wire or electrically conductive particles in the connecting-layer micro-wire are sintered, welded, or agglomerated to electrically conductive particles in the top-layer micro-wire.

19. The imprinted micro-wire structure of claim 1, wherein the connecting-layer micro-wire and the bottom-layer micro-wire are indistinguishable from each other or wherein the connecting-layer micro-wire and the top micro-wire are indistinguishable from each other.

20. The imprinted micro-wire structure of claim 1, wherein at least a portion of the top-layer micro-wire extends primarily in a direction different from the direction in which at least a portion of the connecting-layer micro-wire primarily extends or wherein at least a portion of the bottom-layer micro-wire extends primarily in a direction different from the direction in which at least a portion of the connecting-layer micro-wire primarily extends.

21. The imprinted micro-wire structure of claim 1, further including:

a plurality of separate bottom electrodes patterned in the bottom layer, each bottom electrode including a plurality of electrically interconnected bottom-layer micro-wires;

a plurality of separate top electrodes patterned in the top layer, each top electrode including a plurality of electrically interconnected top-layer micro-wires, the top and bottom electrodes overlapping to form an array of capacitors;

a connecting wire connected to each bottom electrode through one or more edge micro-wires.

* * * * *